US 12,085,462 B2

(12) United States Patent
Motz

(10) Patent No.: US 12,085,462 B2
(45) Date of Patent: Sep. 10, 2024

(54) TRANSISTOR-BASED STRESS SENSOR AND METHOD FOR DETERMINING A GRADIENT-COMPENSATED MECHANICAL STRESS COMPONENT

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 285 days.

(21) Appl. No.: 17/583,462

(22) Filed: Jan. 25, 2022

(65) Prior Publication Data

US 2022/0236123 A1    Jul. 28, 2022

(30) Foreign Application Priority Data

Jan. 27, 2021    (DE) .......................... 102021200720.1

(51) Int. Cl.
     *G01L 1/22*      (2006.01)
     *G01L 1/18*      (2006.01)
     (Continued)

(52) U.S. Cl.
CPC ............. *G01L 1/22* (2013.01); *H01L 27/088* (2013.01); *H01L 29/84* (2013.01)

(58) Field of Classification Search
CPC ....... H01L 23/34; H01L 29/84; H01L 27/088; H01L 27/0802; G01L 1/16; G01L 25/00;
(Continued)

(56) References Cited

U.S. PATENT DOCUMENTS 6,441,396 B1 *   8/2002   Adams .................... H01L 22/34
                                                                   257/E23.179
7,592,243 B2      9/2009   Momiyama et al.
(Continued)

FOREIGN PATENT DOCUMENTS

CN         1469488 A      1/2004
CN         1755946 A      4/2006
(Continued)

OTHER PUBLICATIONS

Ewuame, K.A., et al., "CMOS Stress Sensor for 3D Integrated Circuits: Thermo-mechanical Effects of Through Silicon via (TSV) on Surrounding Silicon," Institute of Electrical and Electronics Engineers, 2014, pp. 1-9.
(Continued)

*Primary Examiner* — Brandi N Hopkins
(74) *Attorney, Agent, or Firm* — Harrity & Harrity, LLP

(57) ABSTRACT

A stress sensor includes a semiconductor substrate with a first transistor arrangement and a second transistor arrangement. The first transistor arrangement includes a first transistor with a first source-drain channel region and a second transistor with a second source-drain channel region. The first transistor and the second transistor are aligned relative to each other such that the current flow directions in the first and the second source-drain channel regions are opposite to each other. The second transistor arrangement includes a third transistor with a third source-drain channel region and a fourth transistor with a fourth source-drain channel region. The third transistor and the fourth transistor are aligned relative to each other such that the current flow directions in the third and the fourth source-drain channel regions are opposite to each other. The stress sensor generates a gradient-compensated output signal used to determine a mechanical stress acting on the semiconductor substrate.

19 Claims, 24 Drawing Sheets

(51) Int. Cl.
*G01L 9/06* (2006.01)
*H01L 27/088* (2006.01)
*H01L 29/84* (2006.01)

(58) Field of Classification Search
CPC ......... G01L 1/005; G01L 1/2281; G01L 1/00;
G01L 1/22; G01L 9/0051; G01L 9/0054;
G01R 33/07; G01R 33/0029; G01R
33/075; G01R 33/0035; G01P 2015/084;
G01P 15/123; G01D 5/145; G01D 3/02;
B81C 1/00158; B81B 3/0072; B81B
3/0018; G01B 7/16
See application file for complete search history.

(56) References Cited

U.S. PATENT DOCUMENTS

| | | | | |
|---|---|---|---|---|
| 9,127,994 | B2* | 9/2015 | Fornara | ................... G01L 1/00 |
| 10,969,444 | B2 | 4/2021 | Motz | |
| 2005/0162160 | A1* | 7/2005 | Ausserlechner | ...... G01L 5/0047 |
| | | | | 324/251 |
| 2007/0026599 | A1 | 2/2007 | Peidous et al. | |
| 2007/0040193 | A1 | 2/2007 | Ajiki | |
| 2015/0166327 | A1 | 6/2015 | Doelle | |
| 2015/0311353 | A1 | 10/2015 | Van Der Wiel | |
| 2018/0059820 | A1 | 3/2018 | Tanemura et al. | |

FOREIGN PATENT DOCUMENTS

| | | |
|---|---|---|
| CN | 101233605 A | 7/2008 |
| CN | 101241030 A | 8/2008 |
| CN | 106395735 A | 2/2017 |
| CN | 110501031 A | 11/2019 |
| DE | 102015103075 A1 | 8/2016 |
| GB | 2521163 A | 6/2015 |
| JP | H08335709 A | 12/1996 |
| KR | 20190063349 A | 6/2019 |
| WO | 2016091896 A1 | 6/2016 |

OTHER PUBLICATIONS

Ting, D., et al., "Design of a high performance CMOS bandgap voltage reference with piecewise linear compensation," Electronics Components and Materials, vol. 37(3), pp. 73-74, Mar. 2018.

* cited by examiner

TRANSISTOR-BASED STRESS SENSOR AND METHOD FOR DETERMINING A GRADIENT-COMPENSATED MECHANICAL STRESS COMPONENT

RELATED APPLICATION

This application claims priority to German Patent Application No. 102021200720.1, filed on Jan. 27, 2021, which is incorporated herein by reference in its entirety.

FIELD

The present disclosure relates to the field of stress sensors, and particularly to a transistor-based stress sensor arranged on a semiconductor substrate.

BACKGROUND

Stress sensors are designed to determine mechanical stress components, such as a mechanical shear stress, a mechanical overall stress, or a mechanical differential stress. The stress sensor described here is a transistor-based stress sensor having a plurality of transistors. A mechanical stress component can be determined based on the output signal of the transistor-based stress sensor.

This output signal may be superimposed by unwanted effects, which may lead to inaccuracies in the determination of the stress component. Static effects that do not change over time can be compensated by relatively simple means. Time-varying effects, on the other hand, the magnitudes of which change over time, are much more difficult to compensate. As electronic circuit elements age, so-called aging effects often occur, which can lead to undesirable behavior. However, such aging effects can be difficult to compensate for or cancel out by calibration.

The temporal change of a particular variable can be described by a gradient. For example, a gradient can indicate the direction and magnitude of the respective temporal change in each variable. A heat source, for example, generates increasing heat as the current supply increases. This increasing heat can be expressed with a thermal gradient.

These time-varying gradient-based effects influence the output signal of a stress sensor in an undesirable way, i.e. the output signal of the stress sensor is distorted. Expressed in more general terms, if one or more gradients are present the output signal of a stress sensor is undesirably influenced or distorted by the direction and/or magnitude of the gradient in question. For example, if a thermal gradient is present, as the heat increases an increasingly distorted output signal is obtained from the stress sensor.

Therefore, it would be desirable to provide a stress sensor that delivers a gradient-compensated output signal, so that the output signal is essentially gradient-free. The gradients to be compensated are preferably first-order gradients.

Such gradient-based effects can have various causes. Thermal gradients, for example, can vary according to a variable heating power. However, there are also layout gradients that can vary according to the layout of the circuit on the semiconductor substrate. Even variable inhomogeneous stress effects, which can occur due to variable global stress in plastic housings, have an undesirable effect on the determination of mechanical stress components. This includes, for example, a variable global stress, which can be caused by the packaging process itself, by moisture, or by soldering.

SUMMARY

According to one or more embodiments, a transistor-based stress sensor is provided that is used to determine a mechanical stress component acting on the semiconductor substrate of the transistor-based stress sensor. Due to the arrangement of the individual transistors within the transistor-based stress sensor described herein, gradients of a variable that can influence the determination of the mechanical stress component can be completely or at least partially compensated. The transistor-based stress sensor described herein thus enables a gradient-compensated determination of a mechanical stress component. A method for the gradient-compensated determination of a mechanical stress component is also provided by means of the transistor-based stress sensor.

The transistor-based stress sensor can preferably be a circuit integrated into a semiconductor substrate as part of a circuit assembly. Integrated circuit assemblies or integrated circuits (ICs) are typically mounted in enclosures to protect the sensitive integrated circuits from environmental effects. However, as an undesirable side effect, it can be observed that even the enclosure and installation of the integrated circuit assembly in a housing can exert a considerable mechanical tension on the semiconductor material and thus on the semiconductor substrate of the integrated circuit assembly. This is particularly true of inexpensive, mass-produced housing forms, such as housing forms in which the integrated circuit assembly is encapsulated by a casting compound.

Due to various piezo effects in the semiconductor material, such as the piezo-resistive effect, piezo-MOS effect, piezo-junction effect, piezo-Hall effect and piezo-tunnel effect, important electrical and electronic parameters of the integrated circuit assembly are also influenced by the action of mechanical stress on the integrated circuit assembly. In the context of the further description the cover term "piezo effects" will be used to refer generally to the changes of electrical or electronic parameters of the circuit assembly integrated in the semiconductor material under the influence of a mechanical tension in the semiconductor material.

A mechanical tension in the semiconductor material causes the properties of the charge carriers to change with regard to charge carrier transport, for example mobility, collision time, scattering factor, Hall constant, etc. In general terms, the piezo-resistive effect specifies how the specific ohmic resistance of the respective semiconductor material behaves under the influence of a mechanical tension. The piezo-junction effect results in changes in the characteristic curves of diodes and bipolar transistors, among other properties. The piezo-Hall effect describes the dependence of the Hall constant of the semiconductor material on the mechanical state of tension in the semiconductor material. The piezo-tunnel effect occurs in reverse-biased, highly-doped, flat lateral p-n junctions. This current is dominated by band-to-band tunnel effects and is also stress-dependent. The piezo-resistive effect and the term "Piezo MOS effect" occasionally used in the literature can be classified in a similar way, since the piezo-MOS effect essentially changes the mobility of the charge carriers in the MOS channel of an MOS field effect transistor under the influence of the mechanical stress in the semiconductor material of the integrated circuit chip, exactly as in the piezo-resistive effect.

It is thus clear that, due to mechanical stresses in the semiconductor material of an integrated circuit assembly, the electrical or electronic characteristics of the integrated circuit assembly cannot be varied or degraded in a predictable manner. In many cases, the performance (or parameters) of the integrated circuit assembly may be reduced, for example, in the form of a reduction in the control range, resolution, bandwidth, current consumption or accuracy, etc.

Specifically, the above-mentioned piezo-resistive effect indicates how the specific ohmic resistance of the respective semiconductor material behaves under the influence of a mechanical voltage tensor and the piezo-resistive coefficients. In the case of integrated circuits (ICs), the respective current I, for example, a control current, a reference current, etc., is generated by circuit elements of the integrated circuit assembly on the semiconductor chip. Essentially, a defined voltage U is generated on an integrated resistor with the resistance R and the current I is coupled out. The current I can therefore be generated in general on any resistive element, for example, even on an MOS field-effect transistor which is in the linear operating range. For example, the voltage U can be generated to be relatively constant with regard to mechanical tensions in the semiconductor material by means of known band-gap principles (apart from the comparatively small piezo-junction effect on the generated band-gap voltage). However, the resistance R is subject to the piezo-resistive effect. Since mechanical tensions in the semiconductor material affect the semiconductor chip in a poorly controllable manner through the housing of the integrated circuit assembly, the resistance R for generating the current I and thus also the generated current I is altered in an unintended and unpredictable manner.

With regard to the above-mentioned piezo effects, it should be noted that the coefficients defining mechanical tensions occurring in the semiconductor material are so-called "tensors", i.e. that the resistance R of a resistive element is changed not only by the strength of the mechanical tension in the semiconductor material, but also by the direction of the tension in the semiconductor material. The directional dependence of the mechanical tension in the semiconductor material applies to the most commonly used {100} silicon material for p- and n-doped resistors Rp, Rn. It should also be noted that for reasons of symmetry, {100} wafers and {001} wafers correspond to each other in cubic crystals.

In the following, a brief explanation is given of previous attempts to reduce the above interfering piezo effects. For example, in {100} silicon material, the mechanical stress dependence of integrated resistors can be reduced by using p-doped resistors instead of n-doped resistors wherever possible, because p-doped integrated resistors generally have smaller piezo coefficients.

In addition, two nominally equally large resistors can be arranged in the layout perpendicular to each other and at a small distance from each other and can be electrically connected in series or parallel (so-called L layout). As a result, the total resistance is as independent as possible of the direction of the mechanical tension in the semiconductor material and thus reproducible as far as possible. At the same time, the piezo-sensitivity of such an arrangement for any direction of mechanical tension also becomes minimal.

In addition, efforts are being made to design the IC housing in such a way that the mechanical stress (the mechanical tensions) on the semiconductor circuit chip can be reproduced more readily. For this purpose, either more expensive ceramic housings can be used or the mechanical parameters of the housing components, i.e. semiconductor circuit chip, lead frame, casting compound, adhesive material or solder material, are matched to one another such that the effects of the various housing components compensate each other as far as possible or are at least as constant as possible with regard to the assembly batch and stress load of the integrated circuit assembly during operation. However, it should be clear that the matching of the mechanical parameters of the housing components is extremely complex, and furthermore the slightest changes in the process sequence will again lead to changes in the influences of the various housing components.

From the above comments it is clear that an undesirable and difficult-to-control influence of the physical function parameters of semiconductor devices of integrated circuit assemblies on a semiconductor circuit chip can be caused by different piezo effects due to mechanical tensions in the semiconductor material. The compensation of the influence of the piezo effects on the physical and electronic functional parameters of the semiconductor components is problematic in the sense that the stress components arising in the semiconductor material are generally neither known in advance nor remain constant over the service life, which means that the mechanical parameters involved in accommodating the integrated circuit assembly in a housing—i.e. the material of the semiconductor chip, of the lead frame, the casting compound, the adhesive or the solder material, for example—can be difficult if not impossible to match in order to provide suitable control over the above-mentioned piezo effects on the semiconductor material and thus on the electronic and physical functional parameters of the semiconductor components.

On this basis, there is a need for improved concepts for compensating piezo effects on integrated circuit assemblies. This need is satisfied by means of the devices and methods as claimed in the independent claims. Extensions that are advantageous in some circumstances are the subject matter of the dependent claims.

According to the concept described here, a transistor-based stress sensor is proposed. This has a semiconductor substrate with a first MOS transistor arrangement and a second MOS transistor arrangement. The two MOS transistor arrangements are arranged in the substrate plane of the semiconductor substrate and preferably structured or integrated in the semiconductor substrate. The first MOS transistor arrangement has a first MOS transistor with a first source-drain channel region and a second MOS transistor with a second source-drain channel region. The first MOS transistor and the second MOS transistor are aligned relative to each other in the substrate plane in such a way that a current flow direction in the first source-drain channel region is opposite to a current flow direction in the second source-drain channel region. This means that the two current flow directions are offset by 180° to each other. The second MOS transistor arrangement has a third MOS transistor with a third source-drain channel region and a fourth MOS transistor with a fourth source-drain channel region. The third MOS transistor and the fourth MOS transistor are aligned relative to each other in the substrate plane in such a way that a current flow direction in the third source-drain channel region is opposite to a current flow direction in the fourth source-drain channel region. Due to this arrangement of the individual transistors relative to each other, the transistor-based stress sensor can provide a gradient-compensated output signal, which is used to determine a mechanical stress component acting on the semiconductor substrate.

In accordance with the embodiments described herein, a method for the gradient-compensated determination of at least one mechanical stress component acting on a semiconductor substrate is also proposed, wherein this mechanical stress component can be determined by means of a transistor-based stress sensor according to the embodiments described herein. The method includes, inter alia, the application of an input signal to the transistor-based stress sensor and tapping off a gradient-compensated output signal of the transistor-based stress sensor. The method also includes comparing the gradient-compensated output signal with a reference signal, wherein a deviation from the reference signal defines a measure of the mechanical stress component to be determined. In addition, the method involves determining the magnitude of the deviation based on a difference value between the gradient-compensated output signal and the reference signal. Alternatively, or additionally, the magnitude of the deviation can be determined based on a factorial ratio between the output signal and the reference signal.

In addition, a stress measuring device with at least two transistor-based stress sensors is proposed in accordance with the embodiments described herein. A first of these at least two transistor-based stress sensors delivers a first gradient-compensated output signal which is used to determine a first mechanical stress component acting on the semiconductor substrate. A second of these at least two transistor-based stress sensors delivers a second gradient-compensated output signal which is used to determine a second mechanical stress component acting on the semiconductor substrate. The first transistor-based stress sensor is arranged in a first substrate region of the semiconductor substrate. The second transistor-based stress sensor is arranged in a second substrate region of the semiconductor substrate, which is different to and spatially separated from the first substrate region. The stress measuring device is designed to determine a total mechanical stress acting on the semiconductor substrate based on the first and second gradient-compensated output signals.

BRIEF DESCRIPTION OF THE DRAWINGS

Some exemplary embodiments are shown in the drawing as examples and are explained below. In the drawings.

DETAILED DESCRIPTION

The following describes exemplary embodiments in more detail with reference to the figures, wherein elements with the same or similar function have the same reference signs.

Method steps that are represented in a block diagram and explained with reference to the same can also be performed in a different order than that shown or described. In addition, method steps relating to a particular feature of a device are interchangeable with the same feature of the device, as is also the case in the other direction.

Where reference is made in the description to compensation of a certain variable, such as a gradient compensation, this can be understood to mean a partial compensation of this variable (e.g. gradient), which is essentially equivalent to a reduction of this variable. However, it can also be understood as a complete compensation of this variable, so that this variable becomes vanishingly small, up to the value zero.

The following exemplary embodiments describe a semiconductor substrate in which silicon or germanium, gallium arsenide (GaAs), InSb, InP, etc., can be used as the semiconductor materials.

In addition, the following describes MOS transistor arrangements, wherein each of these MOS transistor arrangements can have two or more individual transistors each. Purely for the sake of clarity, the following figures show two individual transistors per MOS transistor arrangement. However, this should only be viewed as an example and of course does not exclude the possibility that a MOS transistor arrangement may have more than the two individual transistors shown here.

In order to facilitate understanding of the following detailed description of a transistor-based stress sensor for gradient-compensated stress measurement, the definitions used in the following will now first be presented based on FIGS. 1A to 1C with regard to the semiconductor material used and the specified directions on the same with regard to the crystal orientation of the semiconductor material.

For the production of integrated circuits, the semiconductor wafers, such as silicon wafers or silicon disks, are sawn off from a single-crystal rod in such a way that the wafer surface is assigned to a crystallographic plane. In order to define the respective plane in a cubic crystal, the so-called "Miller indices" are used. FIG. 1A, for example, shows a plan view of a semiconductor wafer that is cut in the (100) plane.

Figure 1A:
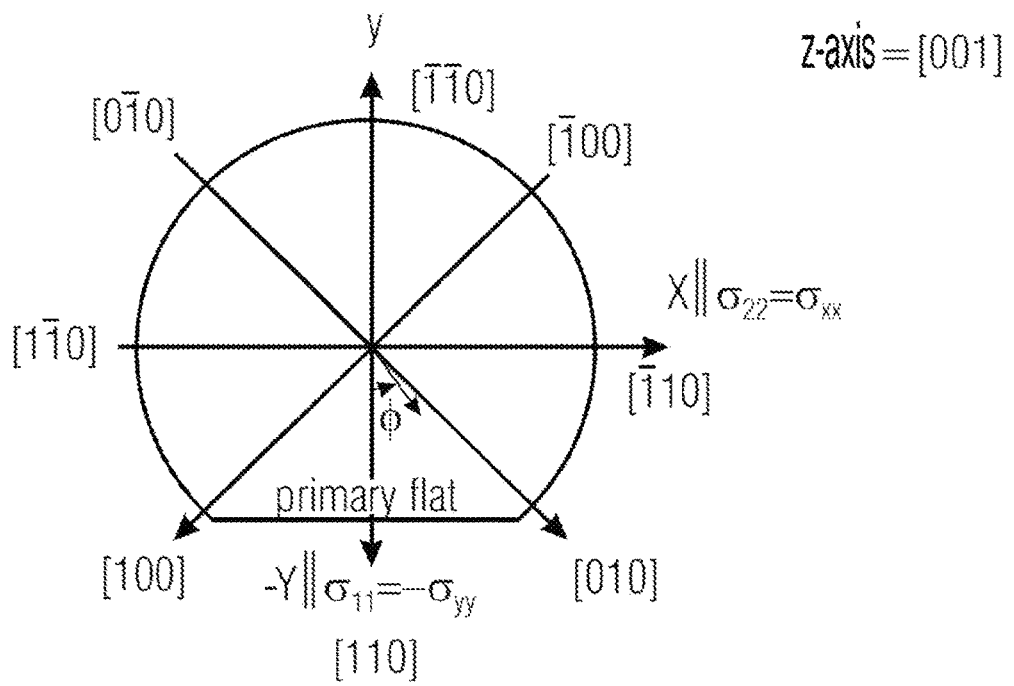
FIGS. 1A-1C show general definitions of crystallographic directions in the plane (wafer plane) of a semiconductor material.
Figure 1B:
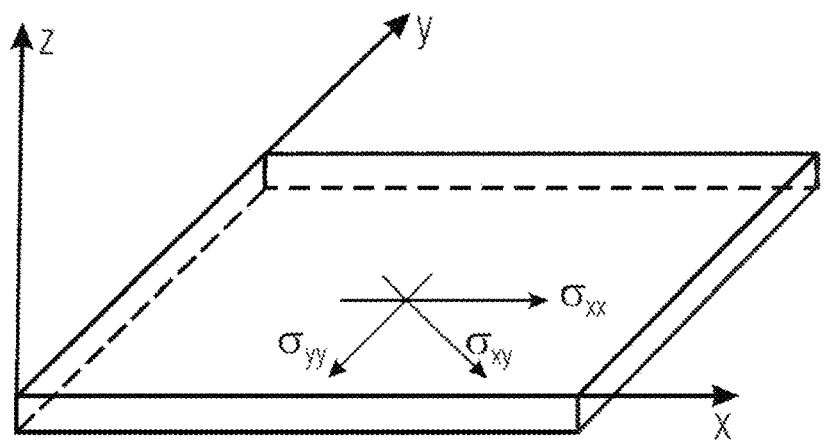
Figure 1C:
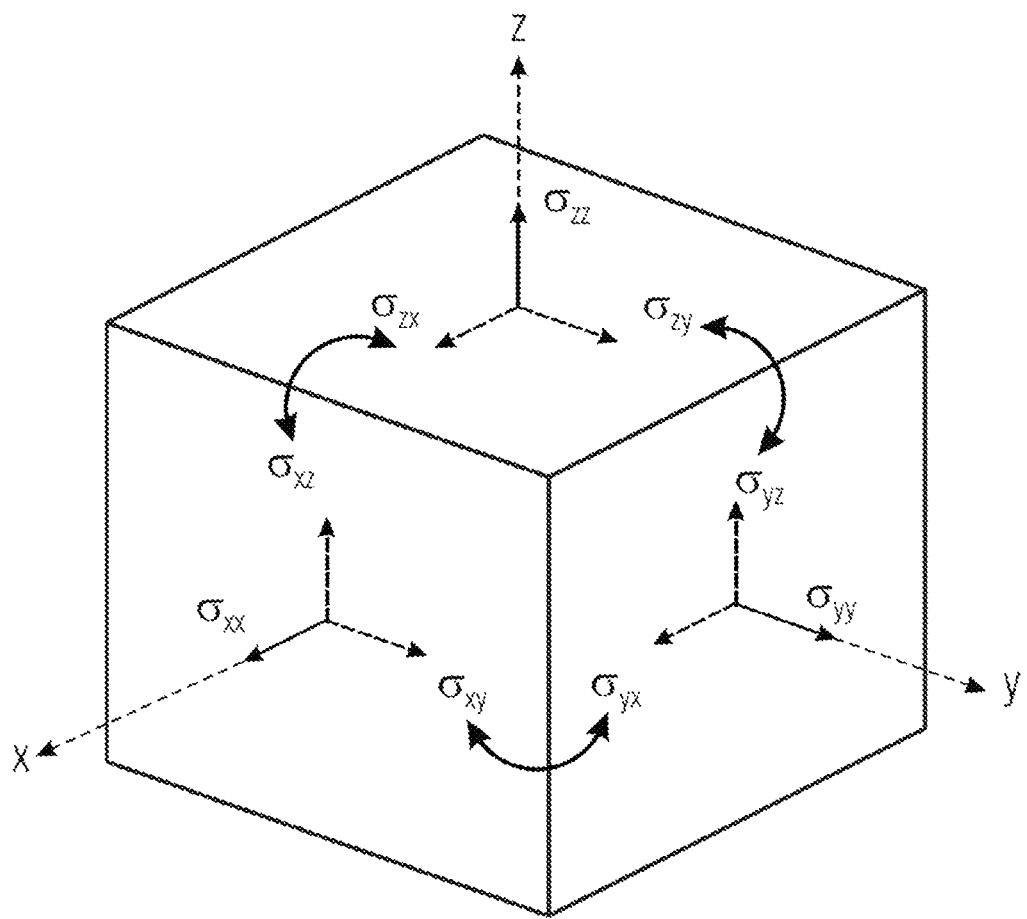

Furthermore, FIGS. 1A to 1C indicate the primary crystallographic directions in the wafer plane, wherein the manufacturers of silicon wafers often provide a so-called "primary flat" on the silicon wafer. Likewise, notches or similar can be used for identification purposes. In the context of this disclosure, such notches should be understood as a primary flat also. Usually, the edges of the rectangular geometries of the circuit structures on the semiconductor chip run parallel or perpendicular to the primary flats.

FIG. 1A shows in particular the crystallographic directions or axes in the plane of the semiconductor wafer, where these are shown in square brackets in the following. The coordinate system is usually used in such a way that the [110] direction is perpendicular or normal to the primary flat, while the [$\bar{1}$10] direction runs parallel to the primary flat. The directions [010] and [100] run at an angle of ±45° to the [110] direction that defines a normal to the primary flat plane. The directions [0$\bar{1}$0] and [$\bar{1}$00] run at an angle of ±45° to the [$\bar{1}$$\bar{1}$0] direction, which also defines a normal (in the opposite direction to [110]) to the primary flat plane.

Furthermore, an angle $\Phi$ is defined with respect to the [110] direction, wherein the angle $\Phi$ is counted counterclockwise from the [110] direction when viewing the top of the wafer from above. Usually, the individual chips are positioned on the wafer in such a way that the directions $\Phi=0°$ and $\Phi=90°$ correspond to the IC vertical or horizontal direction, wherein these directions may be reversed depending on whether the IC is vertical or horizontal. The following text also refers to the direction $\Phi=90°$ as the x-axis [$\bar{1}$10] direction) and the direction $\Phi=0°$ as the negative y-axis ([110] direction).

Assuming that the x-axis is identical to the crystal direction [$\bar{1}$10] and the y-axis is identical to the [$\bar{1}$$\bar{1}$0] crystal direction, this means in particular that the semiconductor circuit chip is manufactured from a {100} semiconductor material (for example, {100} silicon). Usually, the primary flat is then parallel to the x-axis, so that the edges of the semiconductor circuit chip are parallel to the x- and y-axes. The crystal directions [100] and [010] are then identical to the diagonals of the semiconductor circuit chip (see FIG. 1B).

Since a {100} silicon material is used in the majority of applications for integrated semiconductor circuit assemblies, the following statements are mainly related to the numerical values for {100} silicon material relevant to this material in order to simplify the explanations and due to their particular practical significance. However, it should be obvious to the person skilled in the art that other semiconductor materials or other silicon materials can be used accordingly.

Mechanical tension is also referred to as mechanical stress. This mechanical stress is a tensor quantity and refers to the force per unit area acting within a rigid body under the influence of a mechanical load. This force can be represented by cutting the rigid body. This force must theoretically be applied to the cutting surfaces in order to keep the body under the same load.

FIG. 1C shows a small block cut from a rigid body. As can be seen, such a cut through the body can have different orientations, which in turn influences the forces on the cutting surfaces. That is, the force (which is a vector) also depends on the orientation of the cut. Thus, this force (i.e. the mechanical stress) also has more than three degrees of freedom. The block shown has cutting surfaces that are parallel to the x, y, and z axes. The forces on each cutting surface can be decomposed into individual components, each pointing in the x, y and z directions. On each cutting surface there is one component that is perpendicular to the surface: this is the normal tension component (or also: normal stress component) $\sigma_{XX}$. On each cutting surface, two adjacent components appear that run parallel to the surface: these are the transverse strain components (or also: shear strain or stress components) $\sigma_{XY}$, $\sigma_{XZ}$. The first index indicates the direction of the surface and the second index indicates the direction of the force.

Depending on the sign, the normal stress can be a compressive or tensile stress. Normal stresses act perpendicular to the coordinate surface, i.e. the normal and acting directions are the same. The shear stress acts tangentially to the surface and represents a shearing load.

In total, there are nine components, including three cutting surfaces, each having a normal stress component and two shear stress components. The forces on opposite regions (i.e. the negative planes with normal vectors in the negative x, y, z directions) are equal in size, but with a negative sign. Applying the equilibrium of forces or torques to the block shown in FIG. 1C, it is clear that the shear stresses are the same when their indices are reversed: $\sigma_{YZ}=\sigma_{ZY}$, $\sigma_{XZ}=\sigma_{ZX}$, $\sigma_{XY}=\sigma_{YX}$. Ultimately, one obtains six independent components of the stress tensor, i.e. three normal stress components $\sigma_{XX}$, $\sigma_{YY}$, $\sigma_{ZZ}$ and three shear stress components $\sigma_{YZ}$, $\sigma_{XZ}$, $\sigma_{XY}$. From two of the three normal stress components $\sigma_{XX}$, $\sigma_{YY}$, $\sigma_{ZZ}$ a difference can be formed, which leads to a so-called differential stress component, e.g. $\sigma_{XX}-\sigma_{YY}$.

As a rule, not all six stress components need to be considered at once, since in the case of microelectronic packages so-called laminates are usually used, the lateral expansion of which in the x,y directions is significantly greater than their thickness in the z direction (see also FIG. 1B).

Figure 2:
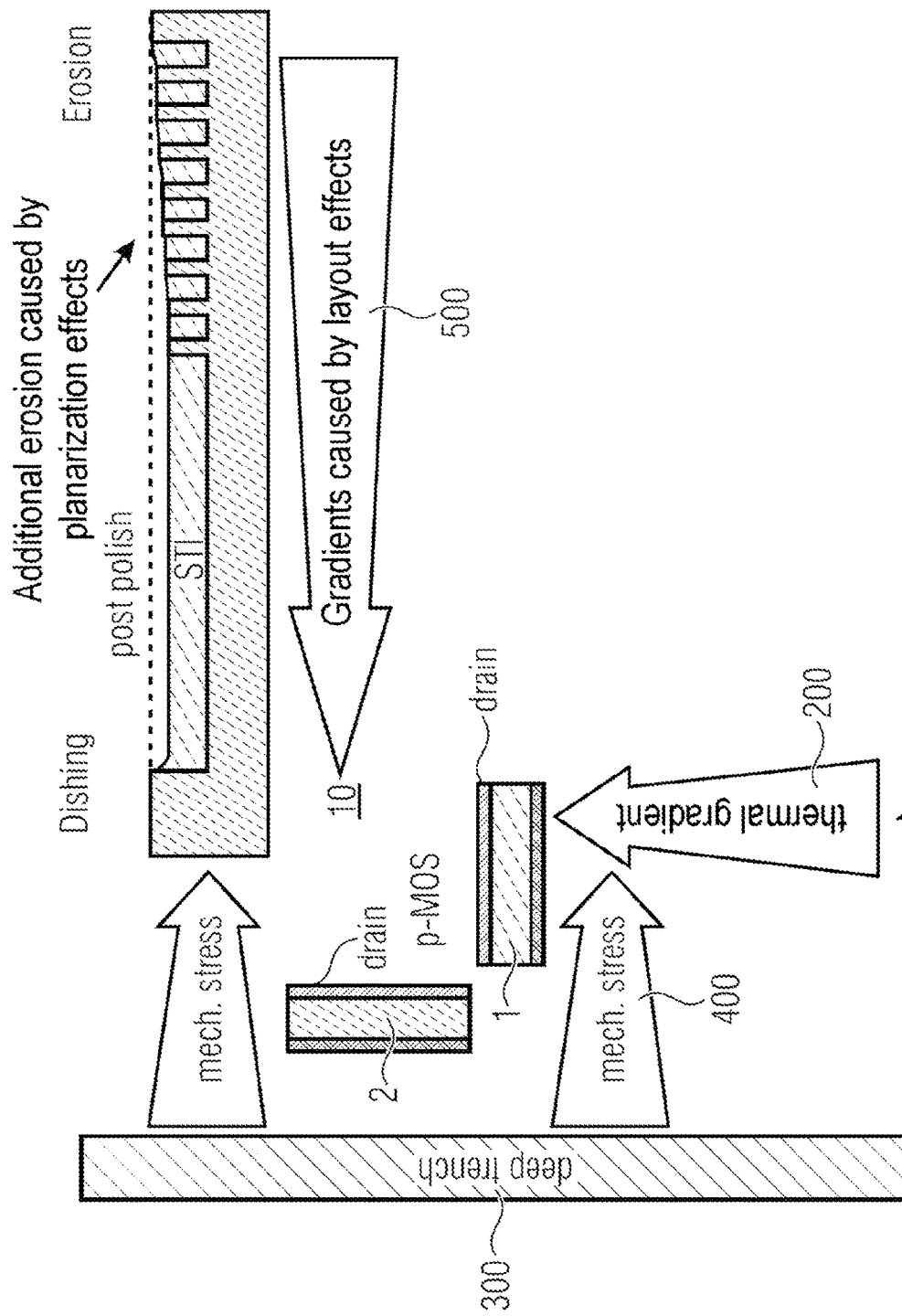
FIG. 2 shows a schematic overview of possible sources of stress components attributable to gradient effects.

As mentioned in the introduction, gradient-based effects cause a time-varying perturbation for the transistor-based stress sensor described here, which results in inaccurate or corrupted output signals. FIG. 2 shows a schematic overview of such gradient-based perturbations and their possible causes.

FIG. 2 shows an example of two transistors 1, 2 of a transistor-based stress sensor 10 arranged in an L-shape relative to each other, according to the embodiments described herein. The transistor-based stress sensor 10 is arranged on a semiconductor substrate, or integrated into the semiconductor substrate, and changes its output signal in response to a mechanical stress acting on the semiconductor substrate. The aim is to measure the mechanical stress that is currently acting on the semiconductor substrate from the outside. However, unwanted stress components also occur, which should not be included in the measurement.

Unwanted static stress components can be compensated relatively easily, for example by a one-off calibration. Time-varying unwanted stress components, on the other hand, are difficult to compensate. These time-varying stress components can be described by gradients. A gradient can describe an inhomogeneous stress in particular. For example, a heat source (e.g. a circuit) 100 may be present on the semiconductor substrate, which releases more and more heat as the operating time increases. This can be expressed by a thermal gradient 200. This thermal gradient influences the output signal of the transistor-based stress sensor in an undesirable way because the stress caused by the thermal gradient should not be included in the measurement.

Unwanted mechanical gradients 400 can also adversely affect the output signal of the transistor-based stress sensor. For example, some substrates have so-called "deep trenches" 300. In the immediate vicinity of these "deep trenches" 300 an unwanted mechanical stress acts, which should not be measured with the transistor-based stress sensor. As the distance from these "deep trenches" 300 increases, the magnitude of the mechanical stress generated by them also decreases. There is therefore a mechanical gradient 400, which changes its magnitude as a function of the distance from the "deep trench" 300.

Other possible mechanical gradients 500 can be induced by certain layout effects, for example. For example, the creation of deep trenches in a process of shallow trench isolation (STI) can lead to mechanical stress, which decreases with increasing distance from the trenches. Here also, a mechanical gradient occurs which should not be measured by the transistor-based stress sensor described here.

The transistor-based stress sensor described here should therefore be designed to measure only the actual external stress acting on the semiconductor substrate (on which the stress sensor is arranged). Gradient-based effects, on the other hand, should not be included in the measurement. Due to the arrangement of the individual transistors of the transistor-based stress sensor described here, it is possible to obtain a gradient-compensated, and in the best case an almost gradient-free, output signal. In particular, first-order gradients can be compensated. These include thermal gradients, mechanical stress gradients, layout gradients, and aging effects, among others.

In other words, the embodiments described herein creates a MOS transistor-based stress sensor, which is designed to compensate in particular first-order thermal stress (inhomogeneous stress) and layout-related gradients. In the following, the structure of the transistor-based stress sensor will be described in more detail with reference to the figures.

Figure 3:
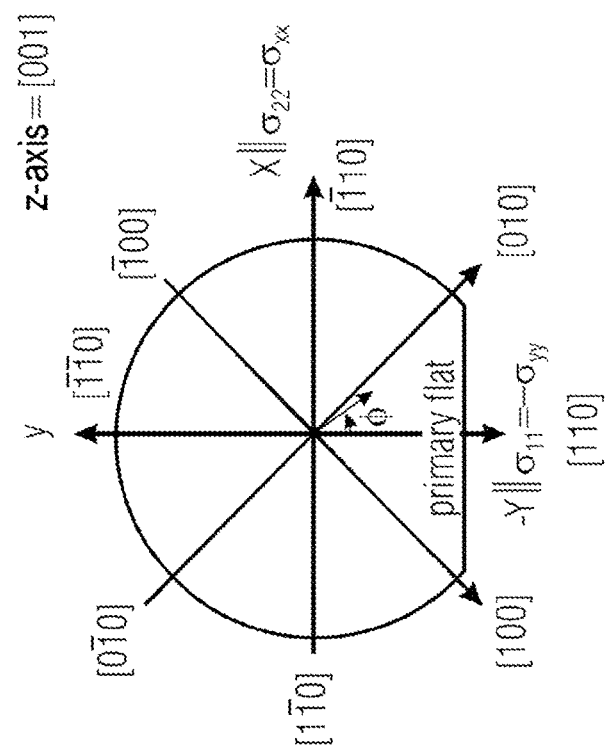
FIG. 3 shows a schematic view of a transistor-based stress sensor in a +/−45° configuration according to an exemplary embodiment.
Figure 3:
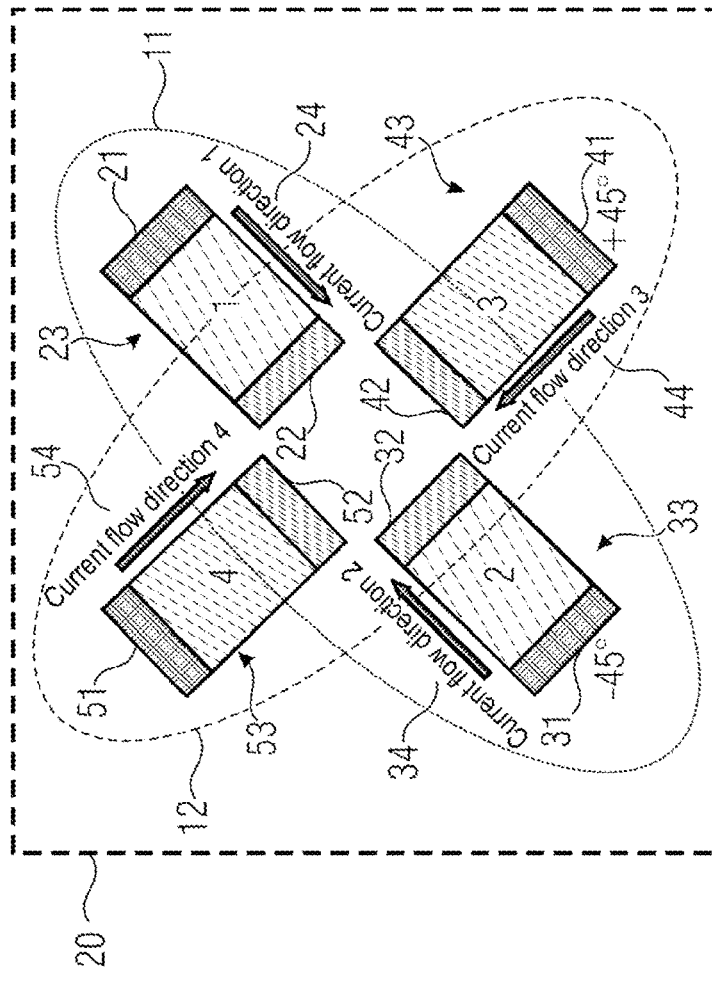

FIG. 3 shows a schematic view of a transistor-based stress sensor 10 according to the embodiments described herein. The transistor-based stress sensor 10 has a semiconductor substrate 20 with a first MOS transistor arrangement 11 and a second MOS transistor arrangement 12.

The first MOS transistor arrangement 11 has a first MOS transistor 1. The first MOS transistor 1 has a source region 21 and a drain region 22. A gate region 23 is located between the source region 21 and the drain region 22. If a current is applied to the first MOS transistor 1, this current flows from the source region 21 to the drain region 22 so that a first current flow direction 24 is produced. The region between the source region 21 and the drain region 22, in which the current flows in this same current flow direction 24, can also be referred to herein as the source-drain channel region. In the present case of the first MOS transistor 1, it can therefore be a first source-drain channel region 23.

The first MOS transistor arrangement 11 additionally has a second MOS transistor 2. The second MOS transistor 2, like the first MOS transistor 1 described above, has a source region 31 and a drain region 32. A second source-drain channel region 33 is located between the source region 31 and the drain region 32. If a current is applied to the second MOS transistor 2, it flows from the source region 31 to the drain region 32, so that a second current flow direction 34 is produced in the second source-drain channel region 33.

In accordance with the embodiments described herein, the first MOS transistor 1 and the second MOS transistor 2 are aligned relative to each other or arranged or positioned on the semiconductor substrate 20 in such a way that the first current flow direction 24 in the first source-drain channel region 23 of the first MOS transistor 1 is opposite to the second current flow direction 34 in the second source-drain channel region 33 of the second MOS transistor 2. This means that the first MOS transistor 1 is rotated by 180° in the substrate plane relative to the second MOS transistor 2.

The second MOS transistor arrangement 12 has a third MOS transistor 3 with a third source-drain channel region 43 and a fourth MOS transistor 4 with a fourth source-drain channel region 53.

This means that the third MOS transistor 3 has a source region 41 and a drain region 42. The previously mentioned third source-drain channel region 43 is located between the source region 41 and the drain region 42. If a current is applied to the third MOS transistor 3, it flows from the source region 41 to the drain region 42 so that the third current flow direction 44 shown in the figure is produced in the third source-drain channel region 43.

The fourth MOS transistor 4, like the MOS transistors 1, 2, 3 described above, has a source region 51 and a drain region 52. The previously mentioned fourth source-drain channel region 53 is located between the source region 51 and the drain region 52. If a current is applied to the fourth MOS transistor 4, it flows from the source region 51 to the drain region 52 so that the fourth current flow direction 54 shown in the figure is produced in the fourth source-drain channel region 53.

In accordance with the embodiments described herein, the third MOS transistor 3 and the fourth MOS transistor 4 are aligned relative to each other or arranged or positioned on the semiconductor substrate 20 in such a way that the third current flow direction 44 in the third source-drain channel region 43 of the third MOS transistor 3 is opposite to the fourth current flow direction 54 in the fourth source-drain channel region 53 of the fourth MOS transistor 4. This means that the first MOS transistor 3 is rotated by 180° in the substrate plane relative to the fourth MOS transistor 4.

This arrangement of the individual transistors 1, 2, 3, 4 relative to each other causes the transistor-based stress sensor 10 to deliver a gradient-compensated output signal. This gradient-compensated output signal can be used to determine a mechanical stress component acting on the semiconductor substrate 20. This can be carried out in a dedicated evaluation circuit, which will be explained in more detail later.

As explained earlier, gradients that can originate from different sources can act upon the semiconductor substrate. These gradients lead to mechanical stress, which can be measured by the individual transistors 1, 2, 3, 4. However, since this gradient-based mechanical stress is not of interest in the stress measurement itself, such a gradient-based stress can lead to an incorrect or inaccurate measurement.

However, with the arrangement of the individual transistors 1, 2, 3, 4 relative to each other as described here, such a gradient-based stress can be compensated. As previously described, the individual MOS transistors 1, 2, 3, 4 are arranged in opposite directions within a MOS transistor arrangement 11, 12, i.e. rotated by 180° in the substrate plane relative to each other. As a result, gradient-based mechanical stress is input to one transistor with a positive sign, while this same gradient-based mechanical stress is input to the other transistor (rotated by) 180° with the same magnitude but negative sign. For example, considering the first MOS transistor 1 and the second MOS transistor 2 of the first MOS transistor arrangement 11, the first MOS transistor 1 then measures a gradient-based mechanical stress with a first sign (e.g. positive sign), and the second MOS transistor 2 measures this exact same gradient-based mechanical stress with the same magnitude but with a second sign (e.g. negative sign) complementary to the first sign. In this way, the unwanted gradient-based mechanical stress is, so to speak, intrinsically compensated for.

The same of course applies correspondingly to the third and fourth transistors 3, 4 in the second MOS transistor arrangement 12.

The transistor-based stress sensor 10 has another special feature regarding the relative arrangement of the individual transistors 1, 2, 3, 4 to each other. In fact, the individual transistors 1, 2, 3, 4 are arranged on the semiconductor substrate 20 at a certain angle to each other in the substrate plane. For clarity, the Miller indices mentioned above are shown again in FIG. 3 at the bottom right.

The transistors 1, 2 of the first MOS transistor arrangement 11 are each arranged in the substrate plane at a first angle $\Phi_1=-45°$. The transistors 3, 4 of the second MOS transistor arrangement 12 are each arranged in the substrate plane at a second angle of $\Phi_2=+45°$.

These angle values relate again to the primary flat plane, more precisely to a normal to the primary flat plane. In this example, the angle values relate to the negative y-axis in the [110] direction.

The orientation of the transistors 1, 2, 3, 4 can best be described by their respective current flow direction 24, 34, 44, 54. For example, the first transistor 1 is arranged in the substrate plane in such a way that its current flow direction 24 runs in the first source-drain channel region 23 at a first angle ($\Phi_1=-45°$) to a normal of the primary flat plane of the semiconductor substrate 20. The same applies correspondingly to the second transistor 2 rotated by 180°, wherein here the positive y-axis can serve as a reference, i.e. the axis in the [$\overline{1}\overline{1}0$] direction. Thus it can also be said that the first transistor arrangement 11 is arranged in the substrate plane in such a way that the respective current flow directions 24, 34 of the associated transistors 1, 2 run at a first angle ($\Phi_1=-45°$) to a normal of the primary flat plane of the semiconductor substrate 20.

The third transistor 3 is arranged in the substrate plane in such a way that its current flow direction 44 runs in the third source-drain channel region 43 at a second angle ($\Phi_2=+45°$) to the normal of the primary flat plane of the semiconductor substrate 20. The same applies correspondingly to the fourth transistor 4 rotated by 180°, wherein here the positive y-axis can serve as a reference, i.e. the axis in the [$\overline{1}\overline{1}0$] direction. Thus it can also be said that the second transistor arrangement 12 is arranged in the substrate plane in such a way that the respective current flow directions 44, 54 of the associated transistors 3, 4 run at a second angle ($\Phi_2=+45°$) to a normal of the primary flat plane of the semiconductor substrate 20.

In combination with the previously described orientations of the individual transistors 1, 2, 3, 4 to each other, the first angle $\Phi_1$ and the second angle $\Phi_2$ are thus perpendicular to each other.

The transistor-based stress sensor 10, shown in FIG. 3, can be designed, due to the arrangement of the individual transistors 1, 2, 3, 4 relative to each other described above, in particular to determine a mechanical shear stress component OXY, $\sigma_{YZ}$, $\sigma_{XZ}$ acting on the semiconductor substrate 20.

Preferably, the first and second MOS transistors 1, 2 of the first MOS transistor arrangement 11 and the third and fourth MOS transistors 3, 4 of the second MOS transistor arrangement 12 are each of the n-channel type. If an MOS transistor arrangement 11, 12 were to have more than the two individual transistors 1, 2, 3, 4, shown here purely as an example, then all of these individual transistors can be of the n-channel type.

Figure 4:
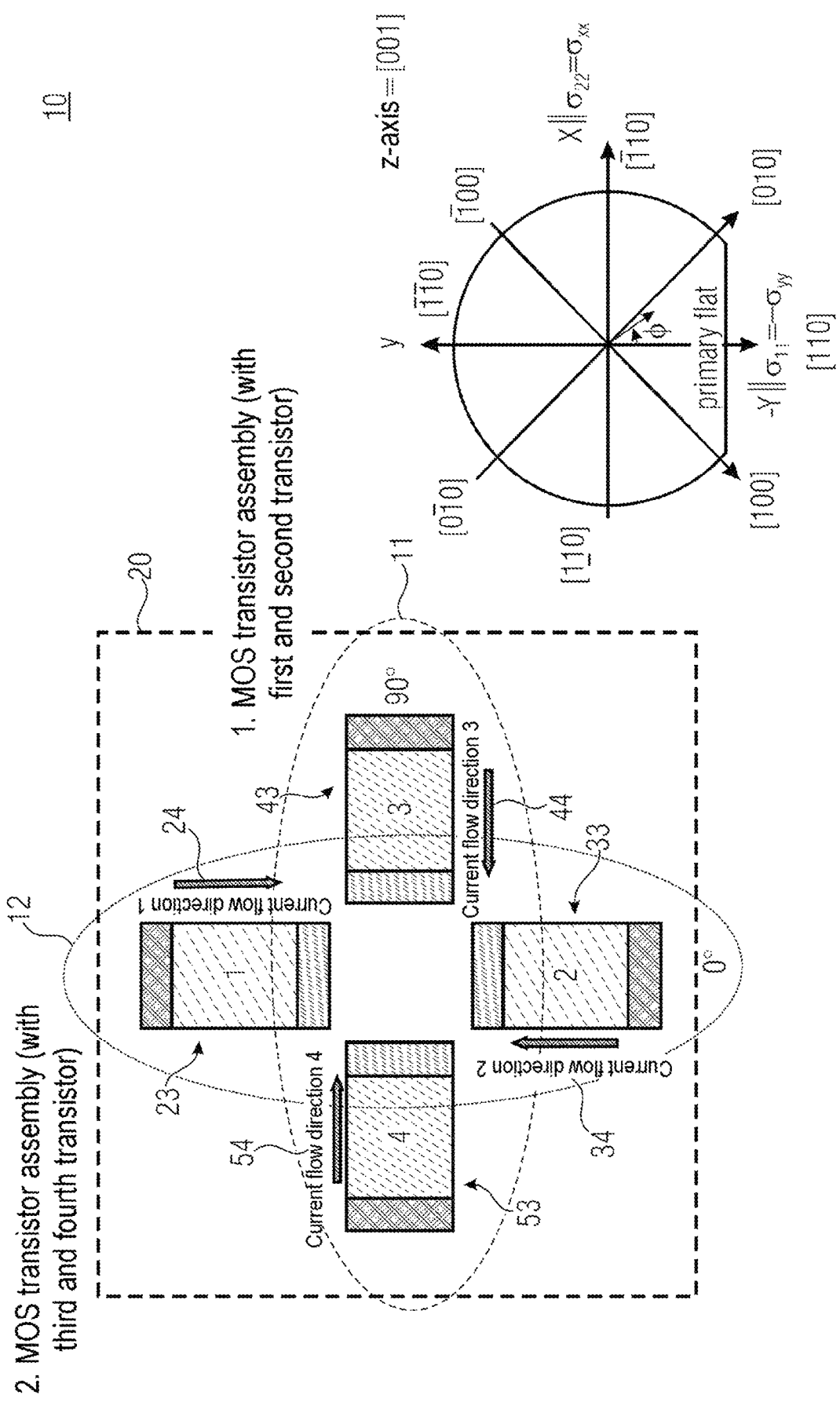
FIG. 4 shows a schematic view of a transistor-based stress sensor in a 0°/90° configuration according to an exemplary embodiment.

FIG. 4 shows an alternative embodiment of a transistor-based stress sensor 10 according to the embodiments described herein. The structure is essentially identical to the transistor-based stress sensor 10 described earlier with reference to FIG. 3, and hence all of the comments above apply correspondingly to the stress sensor 10 shown in FIG. 4.

However, there is a difference in the arrangement of transistors 1, 2, 3, 4 in the substrate plane relative to the primary flat plane. In the stress sensor 10 shown in FIG. 4, the transistors 1, 2 of the first MOS transistor arrangement 11 are each arranged in the substrate plane at a first angle $\Phi_1=90°$. The transistors 3, 4 of the second MOS transistor arrangement 12 are each arranged in the substrate plane at a second angle of $\Phi_2=0°$.

Here also, these angle values relate again to the primary flat plane, more precisely to a normal to the primary flat plane. In this example, the angle values relate again to the negative y-axis in the [110] direction.

The transistor-based stress sensor 10 shown in FIG. 4 can be designed, due to the arrangement of the individual transistors 1, 2, 3, 4 relative to each other described above, in particular to determine a mechanical differential stress component $\sigma_{XX}-\sigma_{YY}$ acting on the semiconductor substrate 20.

Preferably, the first and second MOS transistors 1, 2 of the first MOS transistor arrangement 11 and the third and fourth MOS transistors 3, 4 of the second MOS transistor arrangement 12 can each be of the p-channel type. If an MOS transistor arrangement 11, 12 were to have more than the two individual transistors 1, 2, 3, 4, shown here purely as an example, then all of these individual transistors can be of the p-channel type.

In summary, it can therefore be stated that the transistor-based stress sensor 10 shown in FIG. 3 can be designed in particular to determine a mechanical shear stress component $\sigma_{XY}$, $\sigma_{YZ}$, $\sigma_{XZ}$ acting on the semiconductor substrate 20. This results from the arrangement of the individual transistors 1, 2, 3, 4 at an angle of +/−45°. The transistor-based stress sensor 10 shown in FIG. 4 can be designed in particular to determine a mechanical differential stress component $\sigma_{XX}$−$\sigma_{YY}$ acting on the semiconductor substrate 20. This results from the arrangement of the individual transistors 1, 2, 3, 4 at an angle of 0° or 90°.

In both cases, the transistor-based stress sensor 10 can deliver a gradient-compensated output signal, which in turn is due to the fact that the current flow directions of the individual transistors 1, 2, 3, 4 of the respective MOS transistor arrangement 11, 12 are each oriented opposite each other, resulting in an intrinsic compensation of the respective gradient-based stress input.

Structurally, therefore, in both the exemplary embodiment shown in FIG. 3 and in FIG. 4, the first MOS transistor arrangement 11 can be offset relative to the second MOS transistor arrangement 12 by 90°. The individual transistors 1, 2, 3, 4 can be aligned to one another in such a way that each transistor is offset by 90° to its respective immediate neighbor (both in the clockwise and counter-clockwise direction). Again, this is related to the current flow directions 24, 34, 44, 54 in the respective source-drain channel region 23, 33, 43, 53 of the respective transistor 1, 2, 3, 4.

Figure 5:
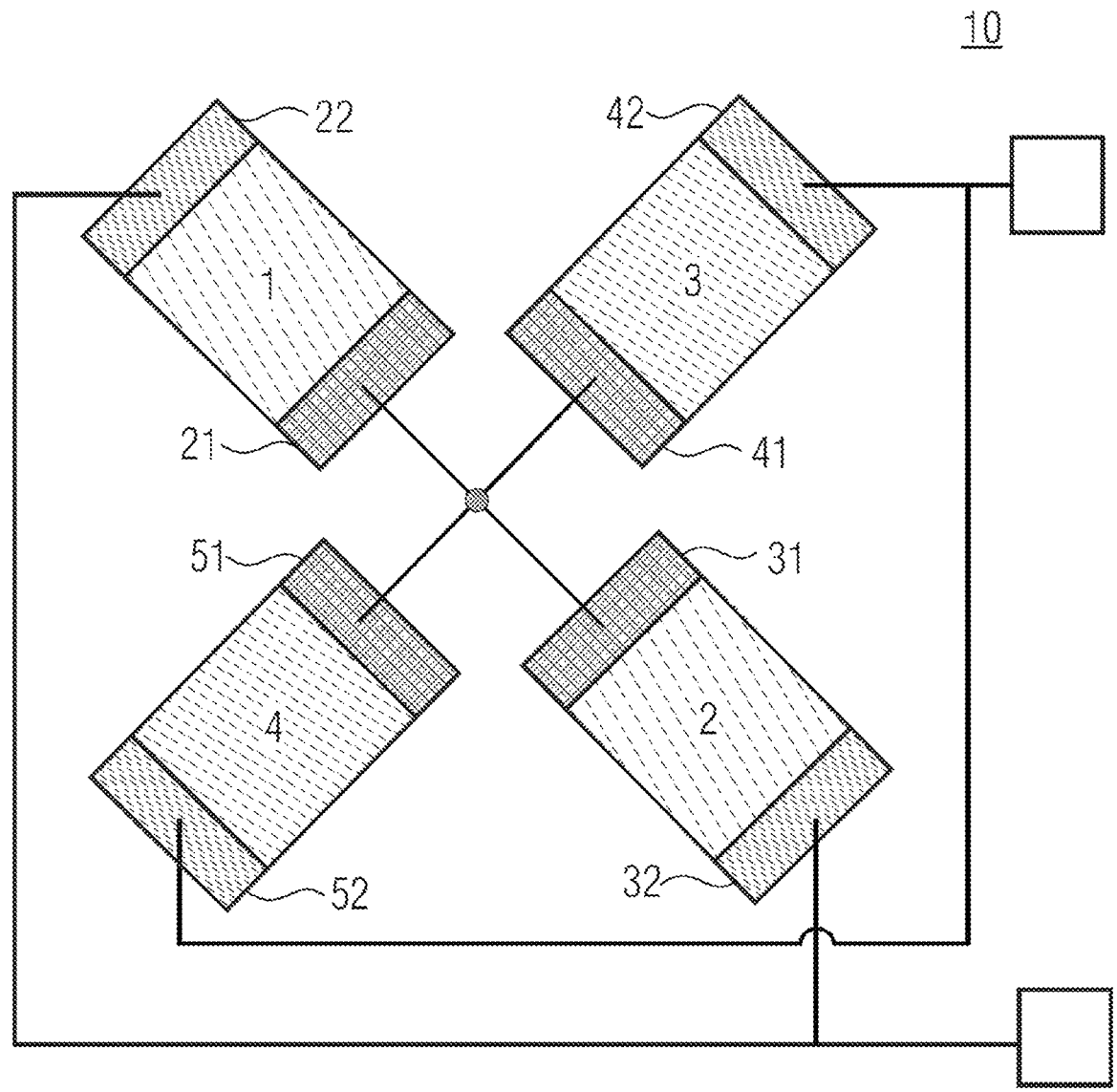
FIG. 5 shows a schematic view of a transistor-based stress sensor in a +/−45° configuration according to an exemplary embodiment.

FIG. 5 shows another example of a transistor-based stress sensor 10. As shown here, the respective drain regions 22, 32, 42, 52 and the respective source regions 21, 31, 41, 51 of the individual transistors 1, 2, 3, 4, can be arranged in reverse order, i.e. rotated by 180°, compared to the exemplary embodiments described earlier with reference to FIGS. 3 and 4. This results in an opposite direction of current flow compared to FIGS. 3 and 4. However, the operating principle of the transistor-based stress sensor 10 described above remains the same.

As can be seen here in FIG. 5, the drain regions 22, 32 of the transistors 1, 2 of the first MOS transistor arrangement 11 can be connected to each other. The drain regions 42, 52 of the transistors 3, 4 of the second MOS transistor arrangement 12 can also be connected to each other. The source regions 21, 31, 41, 51 of all transistors 1, 2, 3, 4 can be at a common potential.

Figure 6:
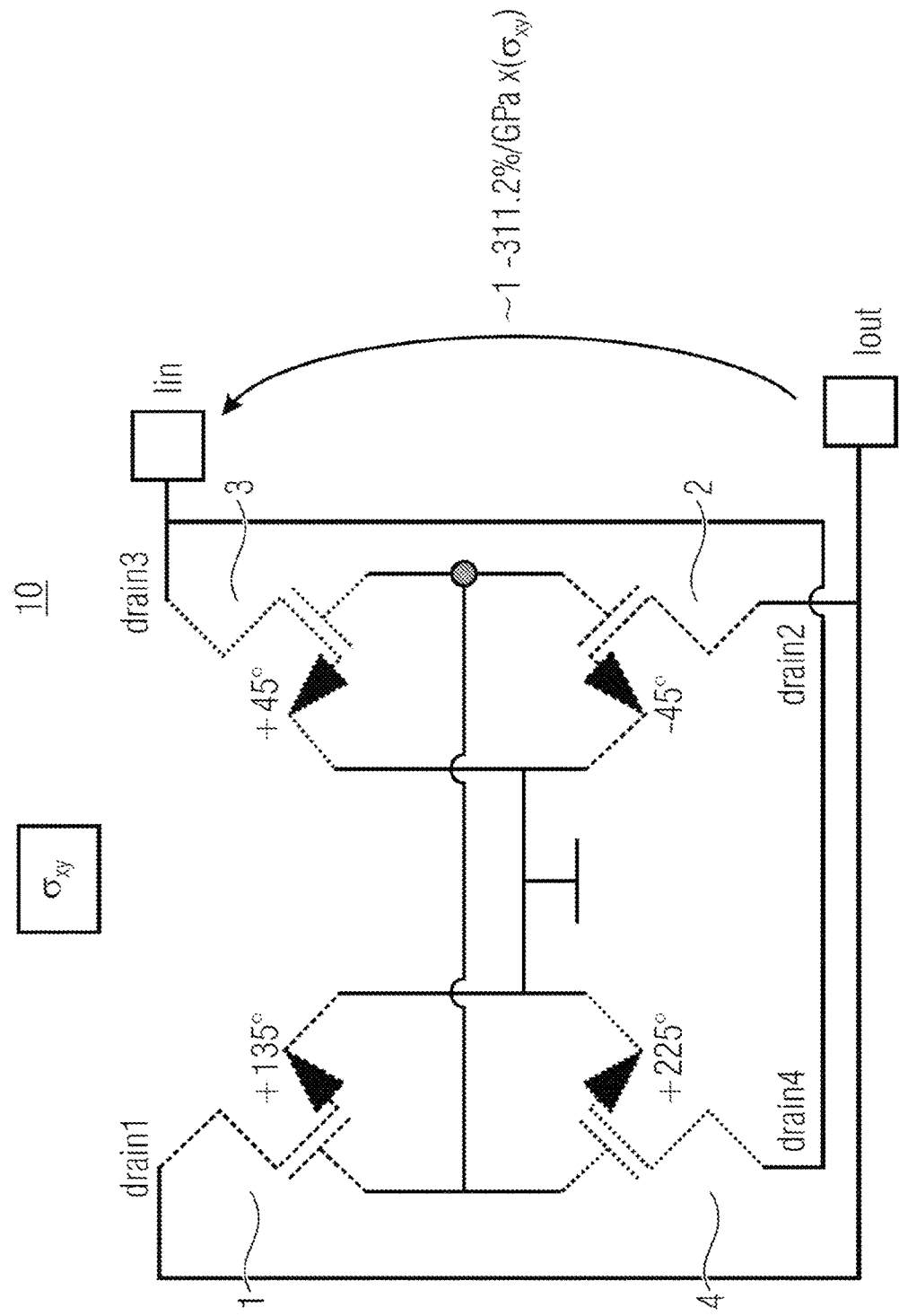
FIG. 6 shows a circuit diagram of a transistor-based stress sensor in a +/−45° configuration according to an exemplary embodiment.

FIG. 6 shows a circuit diagram of a transistor-based stress sensor 10, as previously described with reference to FIG. 3, but in a conceivable alternative notation with regard to the Miller indices in the substrate plane. In the circuit shown, the individual transistors 1, 2, 3, 4 and their respective drain regions (drain1, drain2, drain3, drain4) are indicated. This results in a corresponding current flow direction from the respective source region to the respective drain region of the corresponding transistor 1, 2, 3, 4. It is also evident in this circuit that the corresponding current flow directions of the first and second transistors 1, 2 are directed opposite each other, and that the current flow directions of the third and fourth transistors 3, 4 are also opposite each other.

In this example, the second transistor 2 can be rotated by an angle of −45° and the third transistor 3 by an angle of +45° with respect to a normal to the primary flat plane (e.g. negative y-axis). Accordingly, the first transistor 1 rotated by 180° with respect to the second transistor 2 would be rotated by an angle of 45°+180°=+135° with respect to the normal to the primary flat plane (e.g. negative y-axis), and the fourth transistor 4 rotated by 180° with respect to the third transistor 3 would be rotated by an angle of +45°+180°=+225° with respect to the normal to the primary flat plane (e.g. negative y-axis).

This notation would thus also be conceivable. However, keeping to the notation used in FIG. 3, one could say that the first transistor 1 is rotated by 45° and the second transistor 2 by 45° (+180°) with respect to the normal to the primary flat plane (e.g. negative y-axis), and that the third transistor 3 is rotated by +45° and the fourth transistor 4 by +45° (+180°) with respect to the normal to the primary flat plane (e.g. negative y-axis). It can therefore be said that the first MOS transistor arrangement 11 is rotated by a first angle $\Phi_1$=+45° with respect to the normal to the primary flat plane (e.g. negative y-axis), and that the second MOS transistor arrangement 12 is rotated by a second angle $\Phi_2$=−45° with respect to the normal to the primary flat plane (e.g. negative y-axis).

In the end, one obtains the equivalent circuit for a transistor-based stress sensor 10 shown in FIG. 3, which is designed in particular, due to the arrangement of the individual transistors 1, 2, 3, 4 relative to each other, to determine a mechanical shear stress component $\sigma_{XY}$, $\sigma_{YZ}$, $\sigma_{XZ}$ acting on the semiconductor substrate 20.

Figure 7:
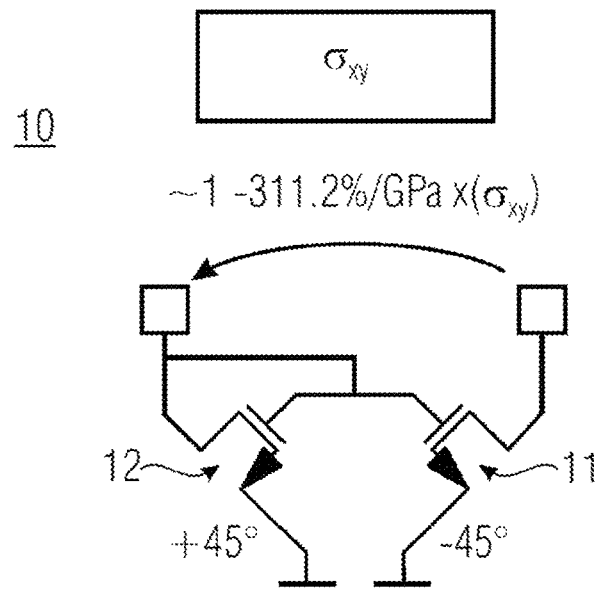
FIG. 7 shows an equivalent circuit diagram of a transistor-based stress sensor in a +/−45° configuration according to an exemplary embodiment.

FIG. 7 shows a simplified equivalent circuit diagram of such a transistor-based stress sensor 10 according to FIG. 6. Here, instead of the individual transistors 1, 2, 3, 4, only the two MOS transistor arrangements 11, 12 are indicated.

The first MOS transistor arrangement 11 illustrated comprises the first and second transistors 1, 2, which are each rotated by −45° (or −45°+180°). The first MOS transistor arrangement 11 is therefore only indicated here with −45°. The second MOS transistor arrangement 12 illustrated comprises the third and fourth transistors 3, 4, which are each rotated by +45° (or +45°+180°). The second MOS transistor arrangement 12 is therefore only indicated here with +45°.

Figure 8:
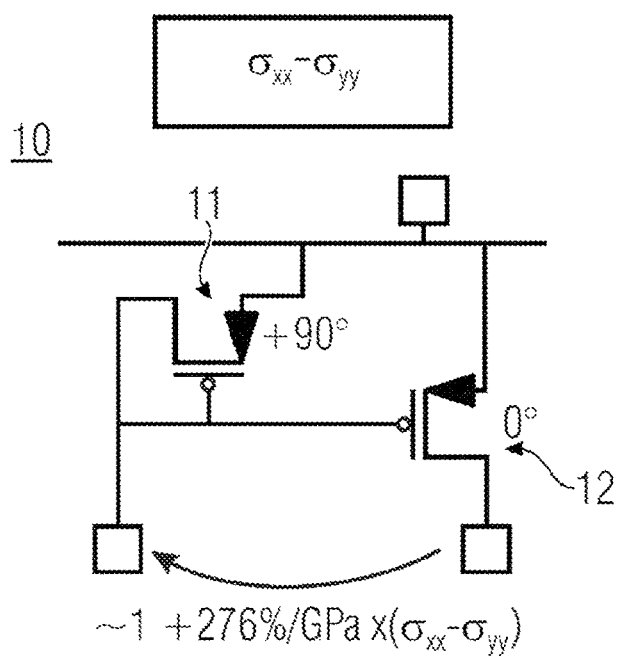
FIG. 8 shows an equivalent circuit diagram of a transistor-based stress sensor in a 0°/90° configuration according to an exemplary embodiment.

FIG. 8, in turn, shows a simplified equivalent circuit diagram of a transistor-based stress sensor 10, as previously described with reference to FIG. 4. Here, the first MOS transistor arrangement 11 is rotated by a first angle $\Phi_1$=90° with respect to the normal to the primary flat plane (e.g. negative y-axis), and the second MOS transistor arrangement 12 is rotated by a second angle $\Phi_2$=0° with respect to the normal to the primary flat plane (e.g. negative y-axis).

The transistor-based stress sensor 10, shown in the simplified equivalent circuit diagram in FIG. 8, can be designed, due to the arrangement of the individual transistors 1, 2, 3, 4 described above, in particular to determine a mechanical differential stress component $\sigma_{XX}$−$\sigma_{YY}$ acting on the semiconductor substrate 20.

The following describes possible designs of individual transistors which can be used in a transistor-based stress sensor 10 according to the embodiments described herein. In addition, in principle, everything that is described here using the example of a +/−45° configuration of MOS transistor arrangements applies equally to MOS transistor arrangements with a 0°/90° configuration, and vice versa. In addition, everything described here using the example of n-MOS transistors applies equally to p-MOS transistors and vice versa.

Figure 9A:
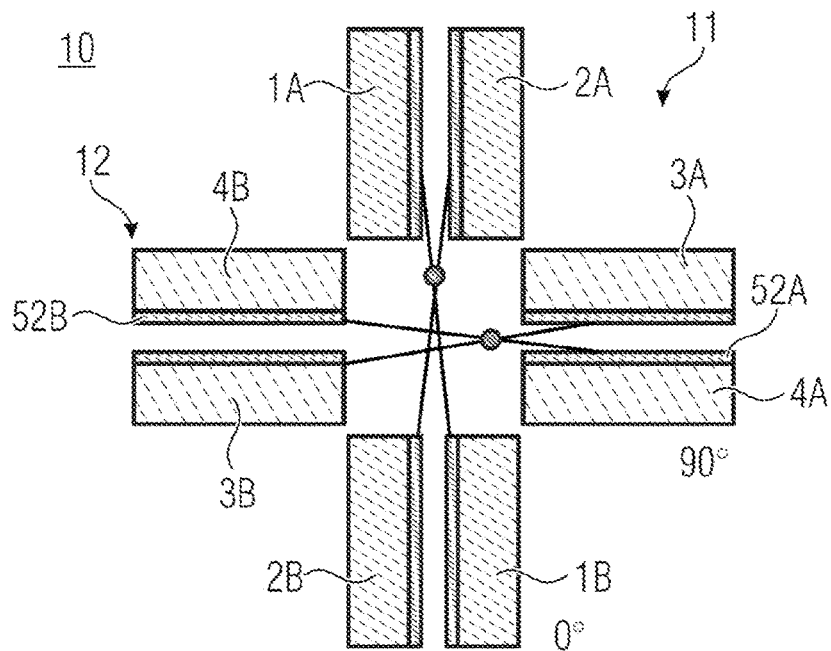
FIG. 9A shows a schematic view of a transistor-based stress sensor in a 0°/90° configuration according to an exemplary embodiment.

FIG. 9A shows, for example, a transistor-based stress sensor 10 with a first MOS transistor arrangement 11 and a second MOS transistor arrangement 12, wherein the two MOS transistor arrangements 11, 12 each have split transistors 1A, 1B, 2A, 2B, 3A, 3B, 4A, 4B.

For example, the first transistor 1 described above can be implemented in two parts, the first transistor 1 having a first transistor part 1A and a second transistor part 1B. The first and second transistor parts 1A, 1B can share a drain region, wherein a drain sub-region 52A belonging to the first transistor part 1A can be electrically connected to a drain subregion 52B belonging to the second transistor part 1B.

The same applies to the second, third and fourth transistors 2, 3, 4 described above, which can also be implemented in two parts. In principle, all drain regions (or drain sub-regions) of the transistors (or transistor parts) of the first MOS transistor arrangement 11 can be interconnected. Likewise, all drain regions (or drain sub-regions) of the transistors (or transistor parts) of the second MOS transistor arrangement 12 can be interconnected.

Figure 9B:
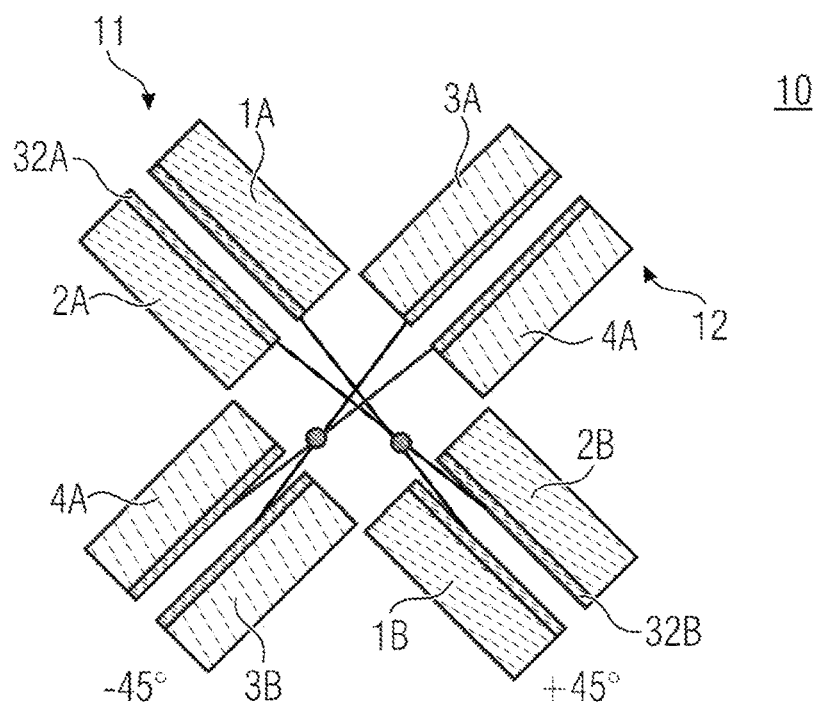
FIG. 9B shows a schematic view of a transistor-based stress sensor in a +/−45° configuration according to an exemplary embodiment.

FIG. 9B shows a transistor-based stress sensor 10 with a similar arrangement of the two MOS transistor arrangements 11, 12. However, a difference is the fact that the individual transistors (or transistor parts) here are arranged in a +/−45° configuration instead of in a 0°/90° configuration described earlier.

Figure 10:
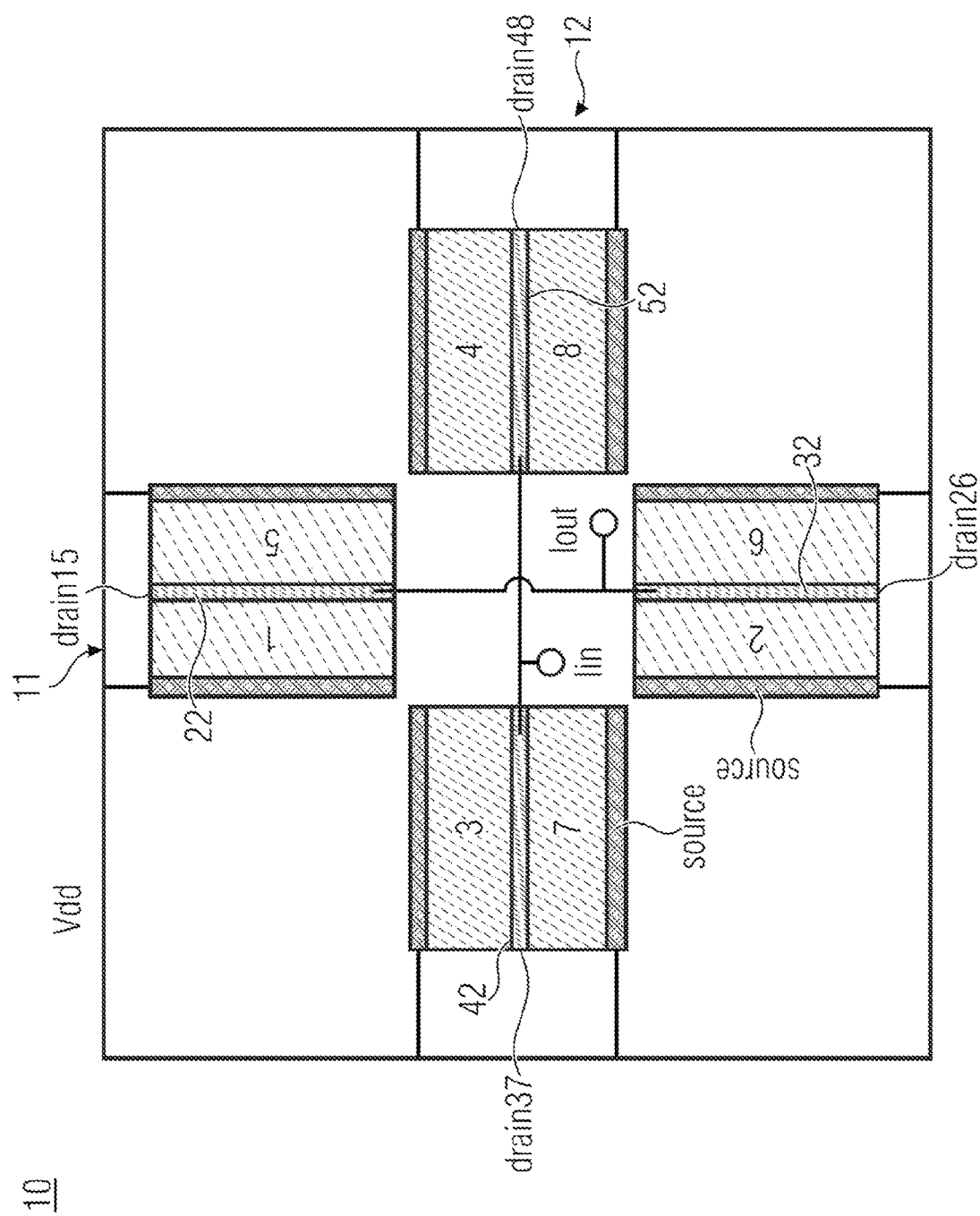
FIG. 10 shows a schematic view of a transistor-based stress sensor in a 0°/90° configuration with split (p-MOS) transistors with common drain terminals according to a further exemplary embodiment.

FIG. 10 shows another possible exemplary embodiment of a transistor-based stress sensor 10 according to the embodiments described herein. Here, each two transistors are connected together, sharing a common drain region.

For example, the first MOS transistor arrangement 11 may have a fifth MOS transistor 5, which shares a common drain region 22 with the first MOS transistor 1 (see 'drain15').

The first MOS transistor arrangement 11 can also have a sixth MOS transistor 6, which shares a common drain region 32 with the second MOS transistor 2 (see 'drain26').

The second MOS transistor arrangement 12 can have a seventh MOS transistor 7, which shares a common drain region 42 with the third MOS transistor 3 (see 'drain37').

The second MOS transistor arrangement 12 can also have an eighth MOS transistor 8, which shares a common drain region 52 with the fourth MOS transistor 4 (see 'drain48').

Figure 11:
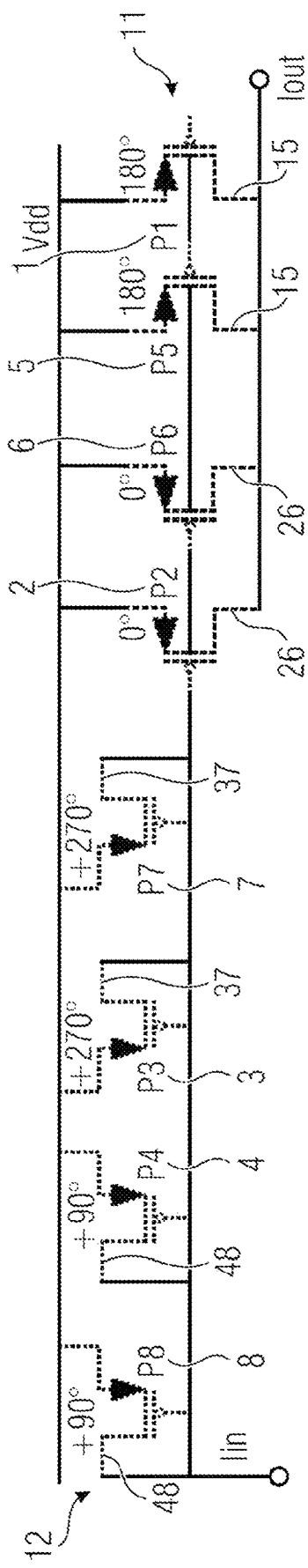
FIG. 11 shows an equivalent circuit diagram of the transistor-based stress sensor of FIG. 10.

FIG. 11 shows an associated circuit diagram. The first transistor arrangement 11 has the first, second, fifth and sixth transistors 1, 2, 5, 6 described earlier. The first transistor 1 and the fifth transistor 5 share a common drain region 15. The second transistor 2 and the sixth transistor 6 share a common drain region 26.

The second transistor arrangement 12 has the third, fourth, seventh and eighth transistors 3, 4, 7, 8 described earlier. The third transistor 3 and the seventh transistor 7 share a common drain region 37. The fourth transistor 4 and the eighth transistor 8 share a common drain region 48.

The fourth and eighth transistors 4, 8 are arranged in the substrate plane in such a way that their current flow direction (from source to drain) runs at an angle of 90° to a normal to a primary flat plane of the semiconductor substrate 20 in each case. The third and seventh transistors 3, 7 are arranged in the substrate plane in such a way that their current flow direction (from source to drain) runs at an angle of 270° to a normal to a primary flat plane of the semiconductor substrate 20 in each case.

The first and fifth transistors 1, 5 are arranged in the substrate plane in such a way that their current flow direction (from source to drain) runs at an angle of 180° to a normal to a primary flat plane of the semiconductor substrate 20 in each case. The second and sixth transistors 2, 6 are arranged in the substrate plane in such a way that their current flow direction (from source to drain) runs at an angle of 0° to a normal to a primary flat plane of the semiconductor substrate 20 in each case.

Figure 12:
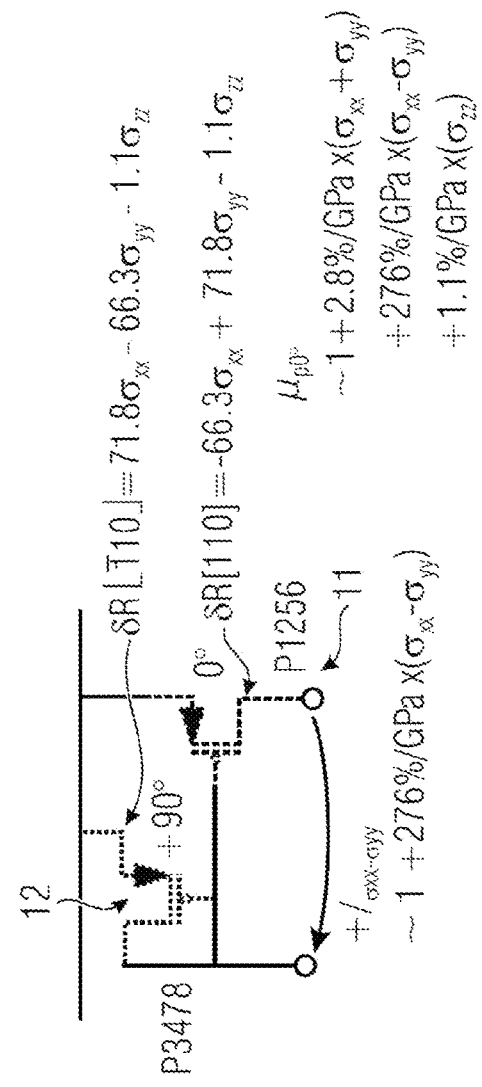
FIG. 12 shows a simplified equivalent circuit diagram of the transistor-based stress sensor of FIG. 10.

FIG. 12 shows a simplified equivalent circuit diagram of FIG. 11. Here again, only the MOS transistor arrangements 11, 12 are shown, wherein their respective individual transistors are combined. The two MOS transistor arrangements 11, 12 here are arranged in a 0°/90° configuration. However, it is also conceivable that the two MOS transistor arrangements 11, 12 could be arranged in a +/−45° configuration.

Figure 13:
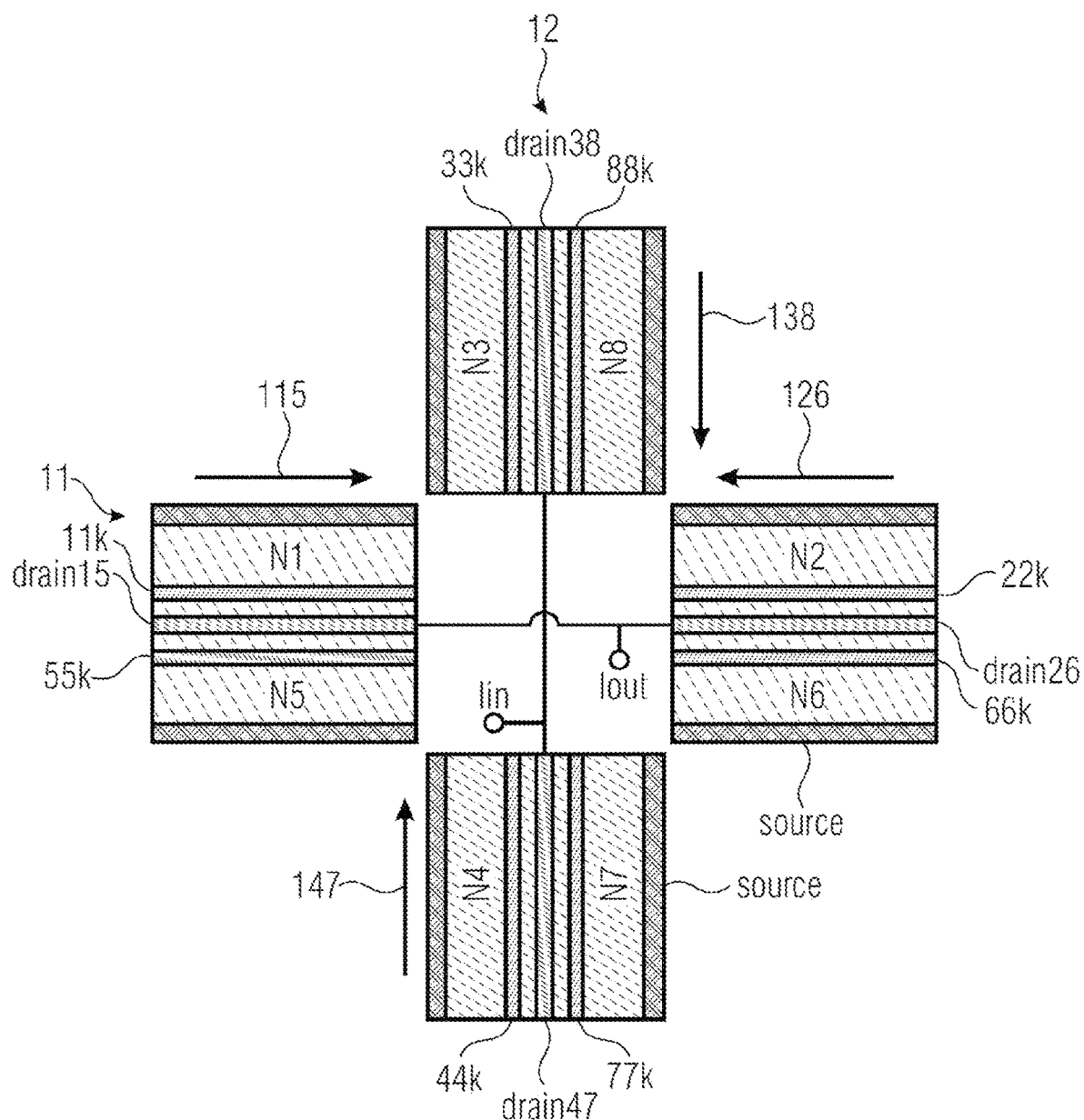
FIG. 13 shows a schematic view of a transistor-based stress sensor with a cascode circuit in a 0°/90° configuration with split (p-MOS) transistors and cascodes with common drain terminals according to an exemplary embodiment.

In addition to the exemplary embodiments discussed so far, multi-transistor cascode circuits are also conceivable. FIG. 13 shows such a possible exemplary embodiment with a 0°/90° configuration, wherein in principle a +/−45° configuration would also be possible again.

Figure 14:
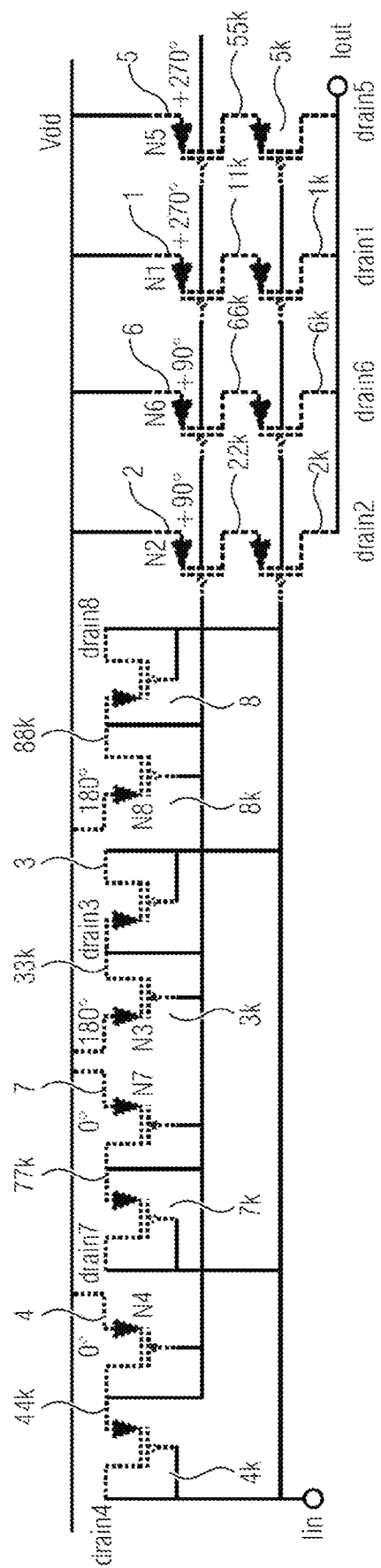
FIG. 14 shows an equivalent circuit diagram of the transistor-based stress sensor of FIG. 13.
Figure 15:
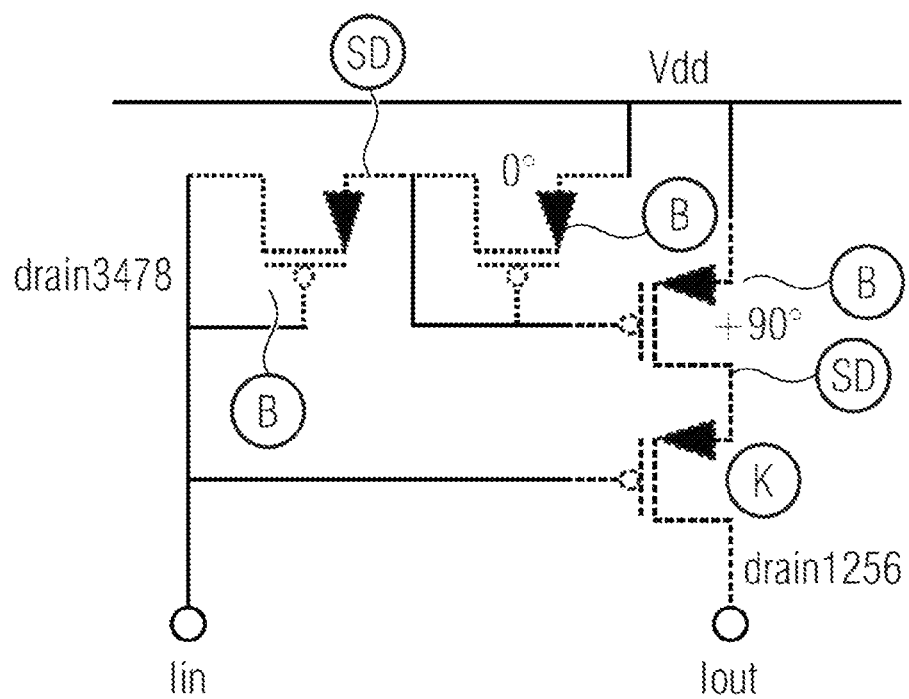
FIG. 15 shows a simplified equivalent circuit diagram of the transistor-based stress sensor of FIG. 13.

FIG. 14 shows the corresponding circuit diagram and FIG. 15 shows the correspondingly simplified equivalent circuit diagram of the cascoded circuit of the first and second MOS transistor arrangements 11, 12 from FIG. 13.

According to this exemplary embodiment, the first MOS transistor arrangement 11 can have a first transistor-cascode circuit N1. This first transistor-cascode circuit N1 can, in turn, have the first transistor 1 as a first base transistor and an additional first cascode transistor 1k (see FIG. 14). The first transistor 1 (base transistor) is interconnected with the first cascode transistor 1k in the first cascode circuit N1, wherein the first transistor 1 and the additional first cascode transistor 1k have a common source-drain terminal 11k. This first cascode circuit N1 is arranged in the substrate plane at an angle of 270° to a normal to a primary flat plane of the semiconductor substrate 20.

The first MOS transistor arrangement 11 can also have a second transistor-cascode circuit N2. This second transistor-cascode circuit N2 can, in turn, have the second transistor 2 as a base transistor and an additional second cascode transistor 2k. The second transistor 2 (base transistor) is interconnected with the second cascode transistor 2k in the second cascode circuit N2, wherein the second transistor 2 and the additional second cascode transistor 2k have a common source-drain terminal 22k. This second cascode circuit N2 is arranged in the substrate plane at an angle of 90° to the normal of the primary flat plane of the semiconductor substrate 20.

The second MOS transistor arrangement 12, in turn, can have a third transistor-cascode circuit N3. This third transistor-cascode circuit N3 can, in turn, have the third transistor 3 as a base transistor and an additional third cascode transistor 3k. The third transistor 3 (base transistor) is interconnected with the third cascode transistor 3k in the third cascode circuit N3, wherein the third transistor 3 and the additional third cascode transistor 3k have a common source-drain terminal 33k. This third cascode circuit N3 is arranged in the substrate plane at an angle of 180° to the normal to the primary flat plane of the semiconductor substrate 20.

The second MOS transistor arrangement 12 can also have a fourth transistor-cascode circuit N4. This fourth transistor-cascode circuit N4 can, in turn, have the fourth transistor 4 as a base transistor and an additional fourth cascode transistor 4k. The fourth transistor 4 (base transistor) is interconnected with the fourth cascode transistor 4k in the fourth cascode circuit N4, wherein the fourth transistor 4 and the additional fourth cascode transistor 4k have a common source-drain terminal 44k. This fourth cascode circuit N4 is arranged in the substrate plane at an angle of 0° to the normal to the primary flat plane of the semiconductor substrate 20.

The arrangement described so far with the four cascode circuits N1 to N4 can form a complete embodiment of the transistor-based stress sensor 10.

The exemplary embodiment shown in FIG. 13 can optionally have further cascode circuits N5 to N8.

For example, the first MOS transistor arrangement 11 can optionally also have a fifth transistor cascode circuit N5. This fifth transistor cascode circuit N5, in turn, can have a fifth transistor 5 as a base transistor and an additional fifth cascode transistor 5k (see FIG. 14). The fifth transistor 5 (base transistor) is interconnected with the fifth cascode transistor 5k in the fifth cascode circuit N5, wherein the fifth transistor 5 and the additional fifth cascode transistor 5k have a common source-drain terminal 55k. This fifth cascode circuit N5 is arranged in the substrate plane at an angle of 270° to the normal to the primary flat plane of the semiconductor substrate 20.

The first MOS transistor arrangement 11 can optionally have an additional sixth transistor cascode circuit N6. This sixth transistor cascode circuit N6, in turn, can have a sixth transistor 6 as a base transistor and an additional sixth cascode transistor 6k (see FIG. 14). The sixth transistor 6 (base transistor) is interconnected with the sixth cascode transistor 6k in the sixth cascode circuit N6, wherein the sixth transistor 6 and the additional sixth cascode transistor 6k have a common source-drain terminal 66k. This sixth cascode circuit N6 is arranged in the substrate plane at an angle of 90° to the normal to the primary flat plane of the semiconductor substrate 20.

The second MOS transistor arrangement 12 can optionally have an additional seventh transistor cascode circuit N7. This seventh transistor cascode circuit N7, in turn, can have a seventh transistor 7 as a base transistor and an additional seventh cascode transistor 7k (see FIG. 14). The seventh transistor 7 (base transistor) is interconnected with the seventh cascode transistor 7k in the seventh cascode circuit N7, wherein the seventh transistor 7 and the additional seventh cascode transistor 7k have a common source-drain terminal 77k. This seventh cascode circuit N7 is arranged in the substrate plane at an angle of 0° to the normal to the primary flat plane of the semiconductor substrate 20.

The second MOS transistor arrangement 12 can optionally have an additional eighth transistor cascode circuit N8. This eighth transistor cascode circuit N8, in turn, can have an eighth transistor 8 as a base transistor and an additional eighth cascode transistor 8k (see FIG. 14). The eighth transistor 8 (base transistor) is interconnected with the eighth cascode transistor 8k in the eighth cascode circuit N8, wherein the eighth transistor 8 and the additional eighth cascode transistor 8k have a common source-drain terminal 88k. This eighth cascode circuit N8 is arranged in the substrate plane at an angle of 180° to the normal to the primary flat plane of the semiconductor substrate 20.

In the first MOS transistor arrangement 11, the first cascode circuit N1 and the fifth cascode circuit N5 can share a common drain terminal (see 'drain15'). Alternatively or in addition, in the first MOS transistor arrangement 11, the second cascode circuit N2 and the sixth cascode circuit N6 can share a common drain terminal (see 'drain26').

In the second MOS transistor arrangement 12, the third cascode circuit N3 and the eighth cascode circuit N8 can share a common drain terminal (see 'drain38'). Alternatively or in addition, in the second MOS transistor arrangement 12, the fourth cascode circuit N4 and the seventh cascode circuit N7 can share a common drain terminal (see 'drain47').

In the first MOS transistor arrangement 11, the first and the fifth cascode circuits N1, N5 can each be oriented in the same direction (with respect to their current flow direction I15). In addition, the second and the sixth cascode circuits N2, N6 can each be aligned in the same direction (with respect to their current flow direction I26). However, the current flow direction I15 of the first and fifth cascade circuits N1, N5 can be oriented opposite to the current flow direction I26 of the second and sixth cascade circuits N2, N6.

In the second MOS transistor arrangement 12, the third and the eighth cascode circuits N3, N8 can each be oriented in the same direction (with respect to their current flow direction I38). In addition, the fourth and the seventh cascode circuits N4, N7 can each be aligned in the same direction (with respect to their current flow direction I47). However, the current flow direction I38 of the third and eighth cascade circuits N3, N8 can be oriented opposite to the current flow direction I47 of the fourth and seventh cascade circuits N4, N7.

The current flow directions I38, I47 of the first MOS transistor arrangement 11 are each perpendicular to the current flow directions I15, I26 of the second MOS transistor arrangements 12.

FIG. 15 shows a simplified equivalent circuit diagram, wherein all the base transistors are labeled with the upper-case letter 'B', and all the additional cascode transistors are labeled with the upper-case letter 'K'. The respective common source-drain regions are labeled with the upper-case letters 'SD'.

Figure 16:
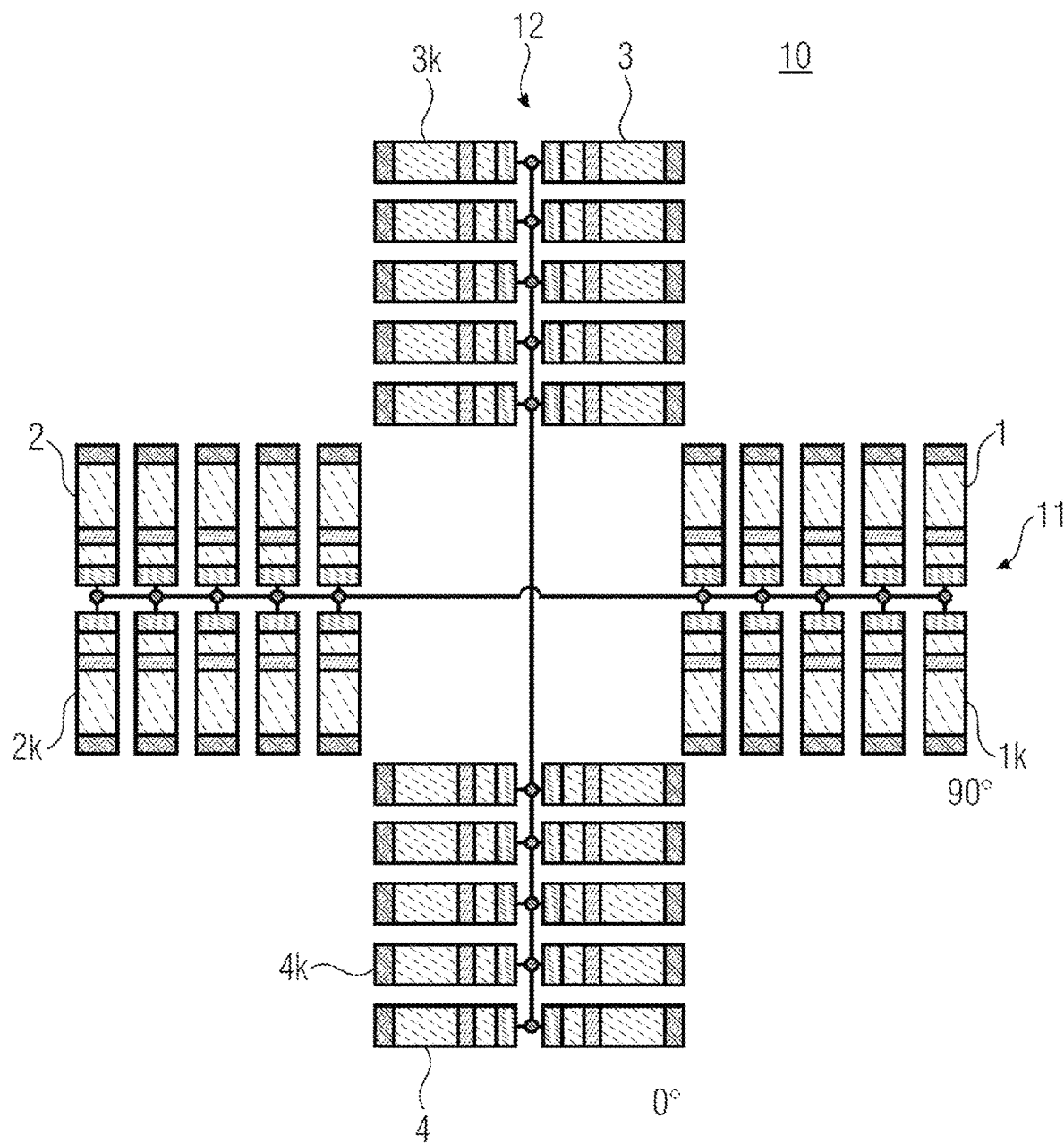
FIG. 16 shows a schematic view of a transistor-based stress sensor with a cascode circuit in a 0°/90° configuration according to a further exemplary embodiment.

FIG. 16 shows another exemplary embodiment of a transistor-based stress sensor 10, in which the first and second MOS transistor arrangement 11, 12 each have a cascode circuit with multiple transistors. For example, the first transistor 1 is interconnected with a plurality of cascode transistors 1k, wherein the drain terminals of the respective transistors 1, 1k are interconnected. Likewise, the second transistor 2 can be interconnected with a plurality of cascode transistors 2k, wherein the drain terminals of the respective transistors 2, 2k are also interconnected.

The same applies to the second MOS transistor arrangement 12. For example, the first transistor 3 can be interconnected with a plurality of cascode transistors 3k, wherein the drain terminals of the respective transistors 3, 3k are interconnected. Likewise, the fourth transistor 4 can be interconnected with a plurality of cascode transistors 4K, wherein the drain terminals of the respective transistors 4, 4K are interconnected.

In comparison to the cascode circuit shown in FIG. 13, in which the individual transistors have shared a common drain region, in the cascode circuit shown in FIG. 16 there are multiple instances of individual drain terminals which can be interconnected, however.

The example shown in FIG. 16 shows a 0°/90° configuration. However, it is also conceivable that the two MOS transistor arrangements 11, 12 could be arranged in a +/−45° configuration.

As already mentioned in the introduction, the transistor-based stress sensor 10 delivers a gradient-compensated output signal which is used to determine a mechanical stress component acting on the semiconductor substrate 20. FIGS. 17 to 23 show possible embodiments of evaluation circuits 110, which are designed to determine the corresponding mechanical stress component based on the output signal of the respective stress sensor 10.

According to these non-limiting exemplary embodiments, the evaluation circuits 110 can be designed to compare the gradient-compensated output signal 111 of the transistor-based stress sensor 10 with a reference signal 112, wherein a deviation from the reference signal 112 defines a measure of the mechanical stress component to be determined.

The magnitude of the reference signal 112 can be essentially equal to the magnitude of the input signal 114 of the transistor-based stress sensor 10. This means that the input signal 114 and the reference signal against which the output signal 111 of the stress sensor 110 is compared can be the same size.

According to a first conceivable exemplary embodiment, the evaluation circuits 110 can be designed to determine the magnitude of the deviation based on a difference between the gradient-compensated output signal 111 and the reference signal 112.

According to a second conceivable exemplary embodiment, the evaluation circuits 110 can be designed to determine the magnitude of the deviation based on a factorial ratio between the gradient-compensated output signal 111 and the reference signal 112.

Figure 17:
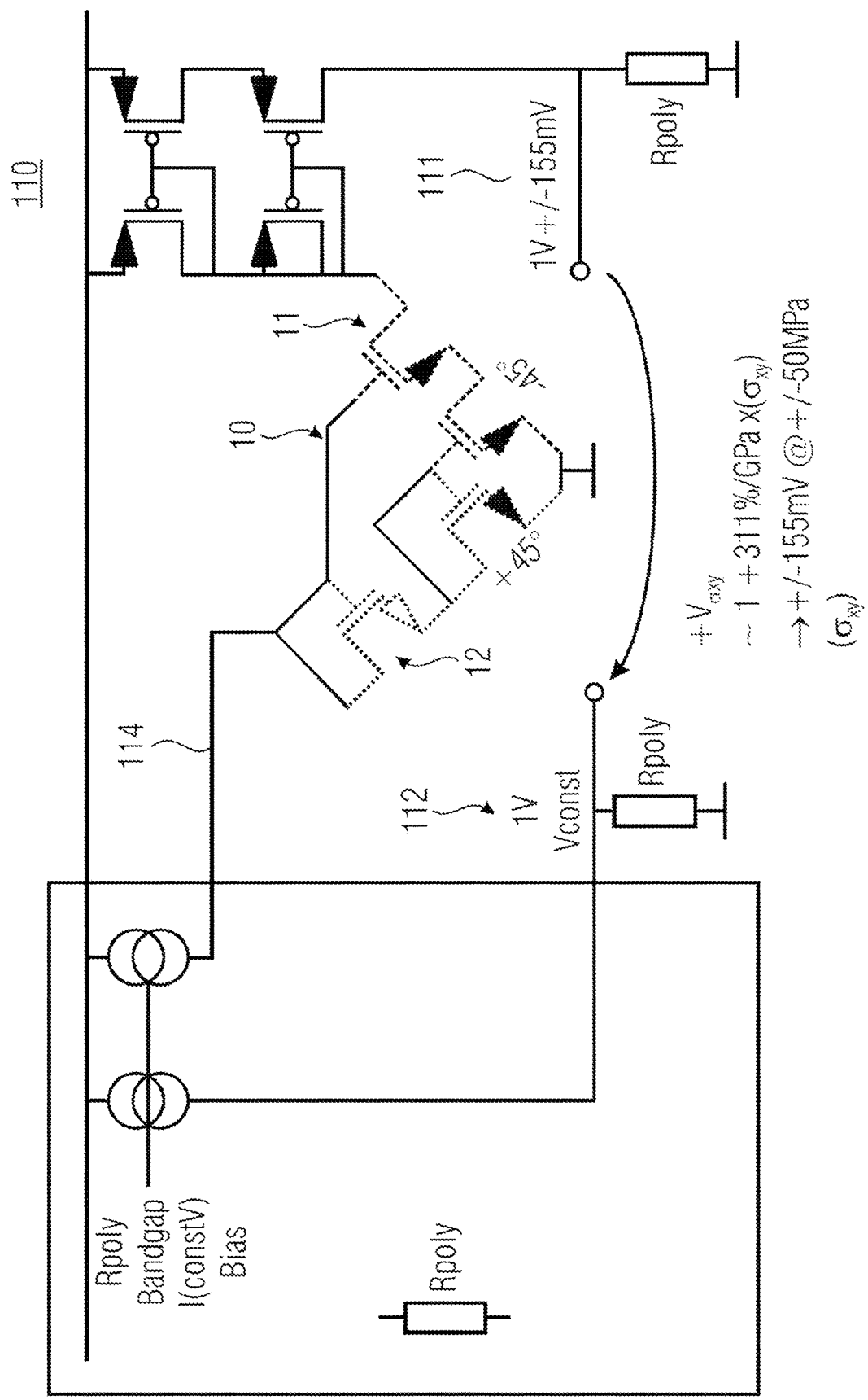
FIG. 17 shows a circuit diagram of a transistor-based stress sensor in a +/−45° configuration with a voltage-based evaluation circuit according to an exemplary embodiment.

FIG. 17 shows a first exemplary embodiment of an evaluation circuit 110 for a transistor-based stress sensor 10 in a +/−45° configuration. As already mentioned, the arrangement of the first MOS transistor arrangement 11 and the second MOS transistor arrangement 12 in the substrate plane at an angle of +/−45° is particularly suitable for determining a mechanical shear stress component $\sigma_{XY}$, $\sigma_{YZ}$, $\sigma_{XZ}$. Transistors of the n-channel type are preferably applicable for this purpose.

An input signal 114 with an essentially constant bias voltage is fed into the transistor-based stress sensor 10. The output signal 111 of the transistor-based stress sensor 10 can be compared with a reference signal 112. In this example, the reference signal 112 has a constant voltage of 1V. The constant voltage in this circuit 110 can be matched to a voltage that has a clearly defined temperature dependency if it is determined using band-gap principles. This enables a modified but clearly defined temperature coefficient of the measured stress voltage (output signal 111), which can be used for simplified stress compensation circuits, calculations or algorithms, for example.

In addition, the magnitude of the reference signal 112 can be essentially the same as the magnitude of the input signal 114 which is fed into the transistor-based stress sensor 10. In this example, the deviation of the output signal 111 from the reference signal 112 is +/−155 mV. This deviation corresponds to a measure (direction and/or magnitude) of the mechanical stress component that acts on the semiconductor substrate 20.

According to this exemplary embodiment, the evaluation circuit 110 can be designed to determine the magnitude of the deviation based on a difference (e.g. +/−155 mV) between the gradient-compensated output signal 111 and the reference signal 112.

However, it is also conceivable that the evaluation circuit 110 determines the magnitude of the deviation based on a factorial ratio between the gradient-compensated output signal 111 and the reference signal 112.

Figure 18:
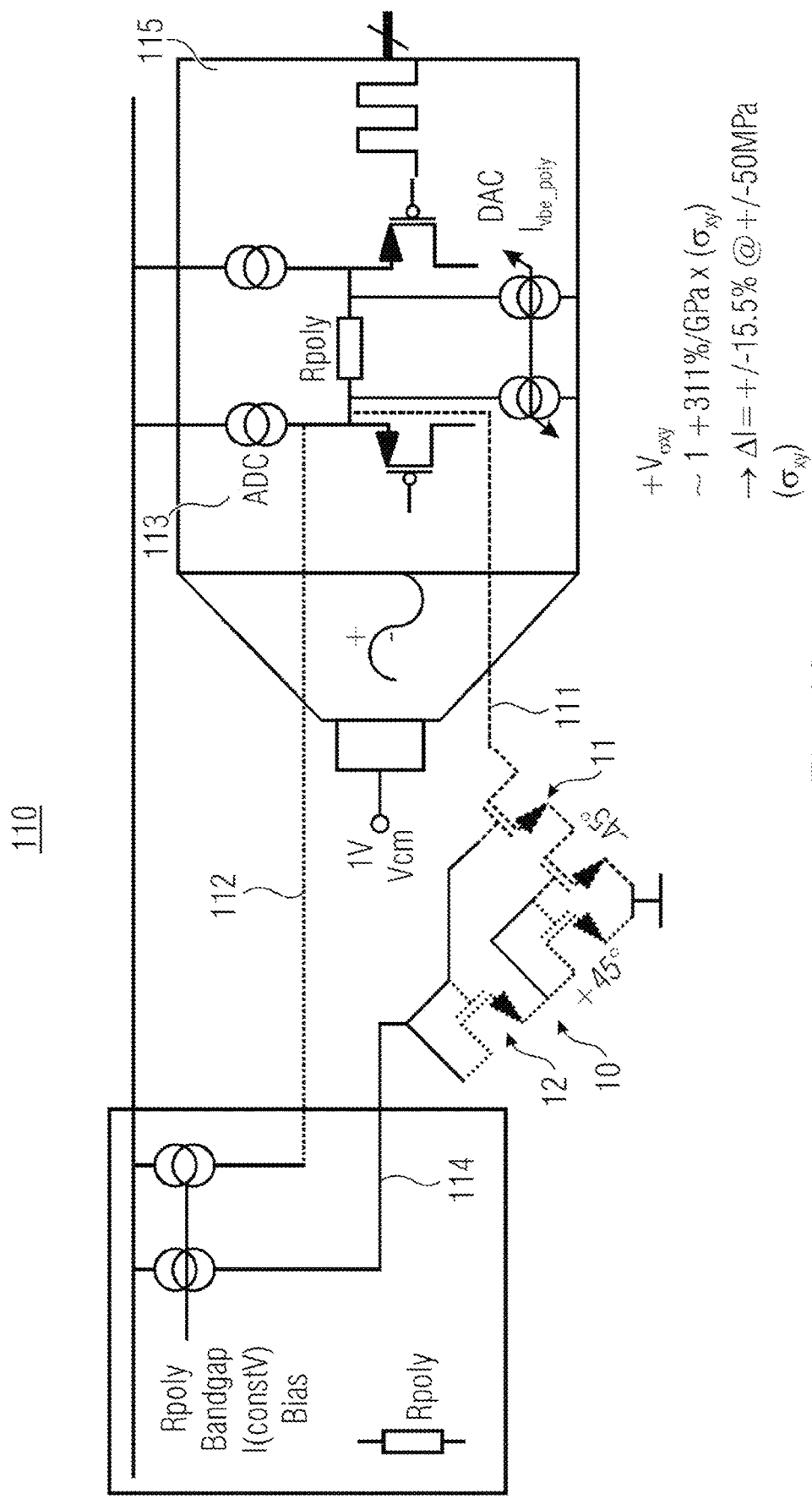
FIG. 18 shows a circuit diagram of a transistor-based stress sensor in a +/−45° configuration with a current-based evaluation circuit according to an exemplary embodiment.

FIG. 18 shows another exemplary embodiment of an evaluation circuit 110 for a transistor-based stress sensor 10 in a +/−45° configuration, in particular for determining a mechanical shear stress component $\sigma_{XY}$, $\sigma_{YZ}$, $\sigma_{XZ}$. Transistors of the n-channel type are preferably applicable for this purpose.

An input signal 114 with an essentially constant current is fed into the transistor-based stress sensor 10. The output signal 111 of the transistor-based stress sensor 10 can be compared with a reference signal 112. In this example, the reference signal 112 has a constant current. A constant current is better suited for use as the input signal 114 or reference signal than a voltage (FIG. 17), since a temperature coefficient can be better regulated by means of constant current, in order to enable stress measurements and higher scaling values, for example.

The magnitude of the reference signal 112 can be essentially the same as the magnitude of the input signal 114 which is fed into the transistor-based stress sensor 10. In this example, the deviation of the output signal 111 from the reference signal 112 is +/−15.5%. This deviation corresponds to a measure (direction and/or magnitude) of the mechanical stress component that acts on the semiconductor substrate 20.

Both the output signal 111 of the stress sensor 10 and the reference signal 112 can be fed into an analog-to-digital converter (ADC) 113. The ADC 113 can be designed to compare the output signal 111 against the reference signal 112 and to generate an appropriately digitized output signal 115 which represents the mechanical stress to be detected.

According to this exemplary embodiment, the evaluation circuit 110 can be designed to determine the magnitude of the deviation based on a factorial ratio between the gradient-compensated output signal 111 and the reference signal 112. This means that in this example, the deviation of the output signal 111 from the reference signal 112 can have a factorial ratio with a factor of 1.155, which corresponds to a percentage of 15.5%.

However, it is also conceivable that the evaluation circuit 110 determines the magnitude of the deviation based on a difference value between the gradient-compensated output signal 111 and the reference signal 112.

Figure 19:
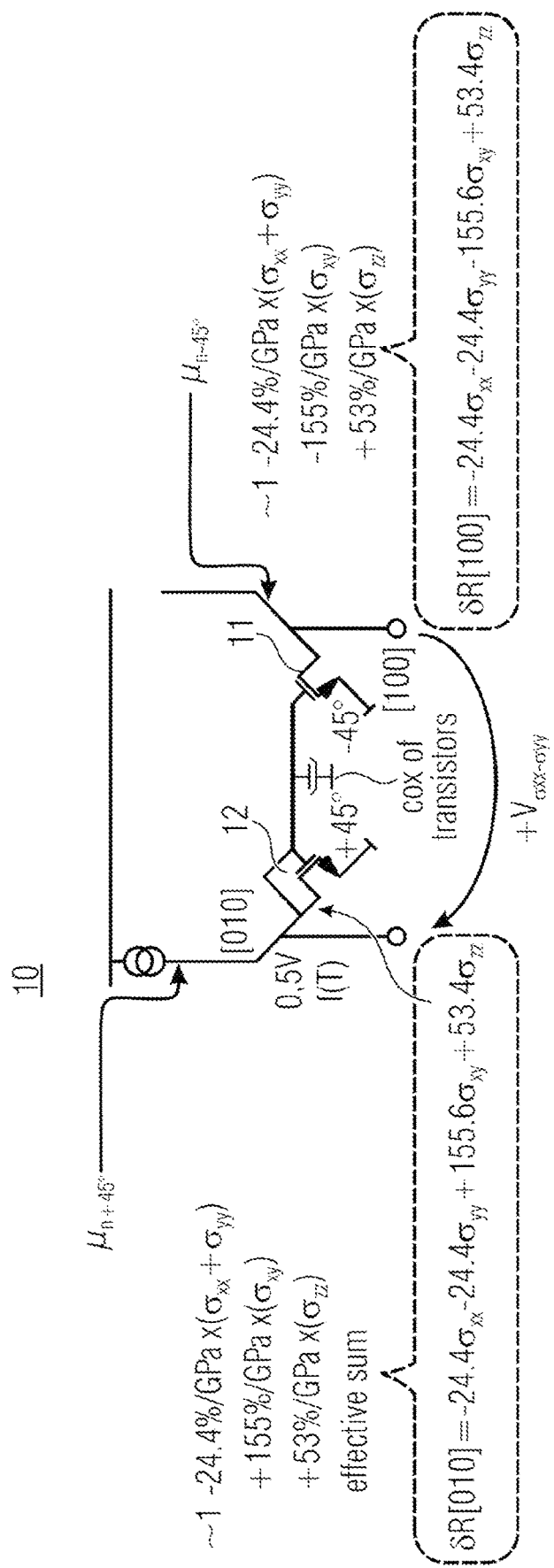
FIG. 19 shows a circuit diagram of a transistor-based stress sensor in a +/−45° configuration for determining the mechanical stress components according to an exemplary embodiment.

FIG. 19 shows a schematic equivalent circuit diagram of the transistor-based stress sensor 10 together with the respective stress dependencies of the individual MOS transistor arrangements 11, 12 in a +/−45° configuration. For example, the first MOS transistor arrangement 11 shown in the left-hand side of FIG. 19 can be aligned in the [010] direction, and the second MOS transistor arrangement 12 shown in the right-hand side of FIG. 19 can be aligned in the [100] direction, for example.

The two MOS transistor arrays 11, 12 have directional sensitivities to mechanical stress. These sensitivities can be determined, for example, from changes in the resistance of the respective MOS transistor arrangement 11, 12.

For example, the first MOS transistor array 11, aligned in the [010] direction, has the following total direction-dependent sensitivities (expressed as a % of the resistance change):

$$\delta R[010] = -24.4\delta_{xx} - 24.4\delta_{yy} + 155.6\delta_{xy} + 53.4\delta_{zz}.$$

This means that with a current flow direction in the [010] direction, the total resistance of the first MOS transistor arrangement 11 undergoes a change of −24.4% per GPa in the x direction due to the mechanical normal stress component $\sigma_{xx}$, a change of −24.4% per GPa in the y direction due to the mechanical normal stress component $\sigma_{yy}$, and a change of +53.4% per GPa in the z direction due to the mechanical normal stress component $\sigma_{zz}$. In addition, the total resistance of the first MOS transistor arrangement 11 undergoes a change of +155.6% per GPa in the x and y direction due to the mechanical shear stress component $\sigma_{xy}$.

The second MOS transistor array 12 on the other hand, which is aligned in the [100] direction, has the following total direction-dependent sensitivities (expressed as a % of the resistance change):

$$\delta R[100] = -24.4\delta_{xx} - 24.4\delta_{yy} + 155.6\delta_{xy} + 53.4\delta_{zz}.$$

This means that with a current flow direction in the [100] direction, the total resistance of the second MOS transistor arrangement 12 undergoes a change of −24.4% per GPa in the x direction due to the mechanical normal stress component $\sigma_{XX}$, a change of −24.4% per GPa in the y direction due to the mechanical normal stress component $\sigma_{yy}$, and a change of +53.4% per GPa in the z direction due to the mechanical normal stress component $\sigma_{ZZ}$. In addition, the total resistance of the second MOS transistor arrangement 12 undergoes a change of −155.6% per GPa in the x and y direction due to the mechanical shear stress component $\sigma_{xy}$.

If the sum $\delta R[010]+\delta R[100]$ of these two direction-dependent resistance changes is formed, the normal stress components $\sigma_{XX}$, $\sigma_{YY}$, $\sigma_{ZZ}$ cancel out. These normal stress components can occur due to unwanted gradients that act upon the semiconductor substrate 20. However, due to the symmetrical arrangement of the first and second MOS transistor arrangements 11, 12 relative to each other, these normal stress components cancel out and a gradient-compensated or essentially gradient-free output signal is obtained. As can be seen in FIG. 19, only the shear stress component σxy therefore remains. In total, this results in a resistance change of $$\delta R_{total}=155.6\ \sigma_{XY}+155.6\ \sigma_{XY}=311.2\ \sigma_{XY}.$$

This means that the effective stress dependence of such a stress sensor 10 in a +/−45° configuration according to the embodiments described herein is approximately $$\sim 1-311.2\%/GPa \times (\sigma_{XY})$$

Figure 20:
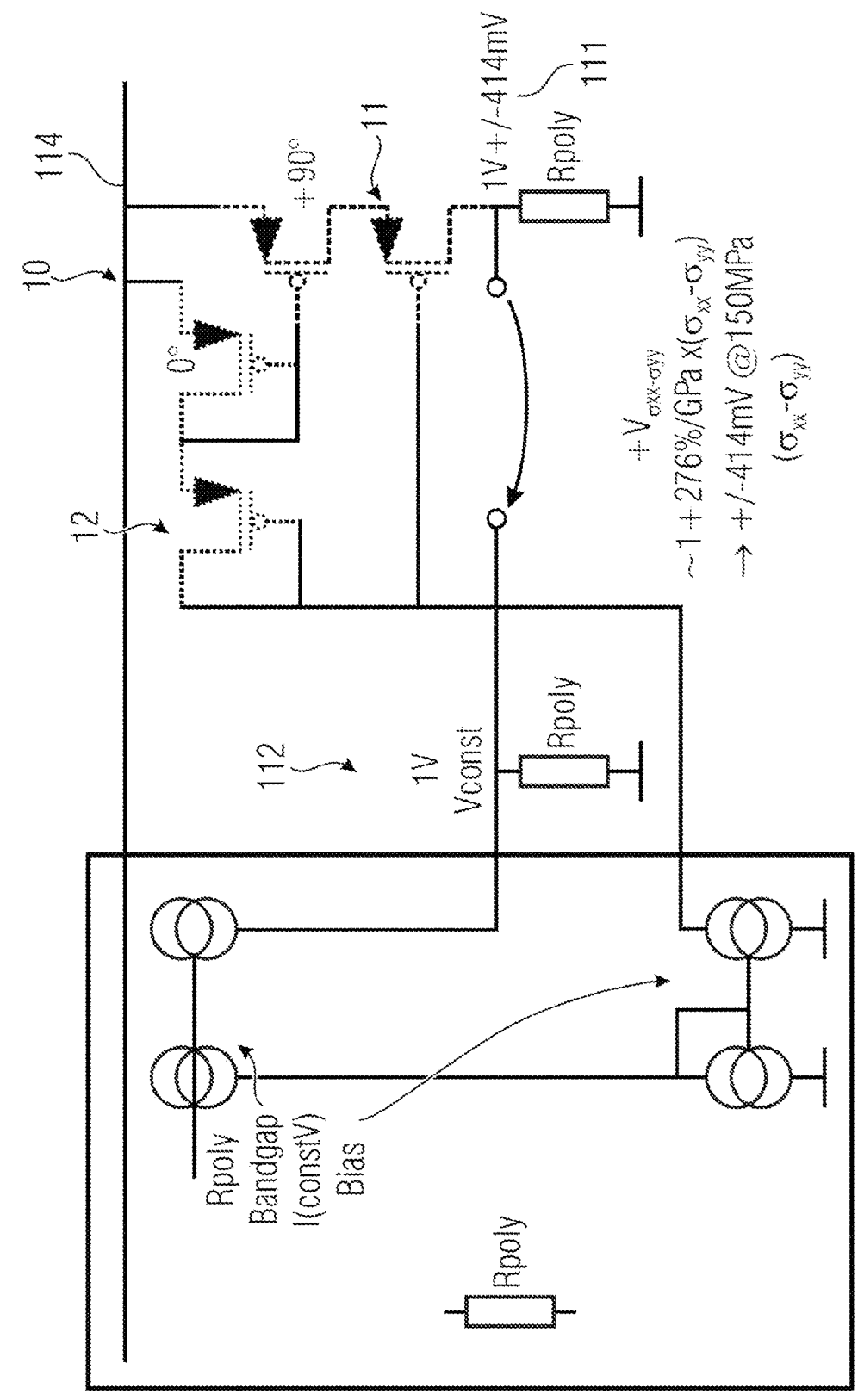
FIG. 20 shows a circuit diagram of a transistor-based stress sensor in a 0°/90° configuration with a voltage-based evaluation circuit according to an exemplary embodiment.

FIG. 20 shows another exemplary embodiment of an evaluation circuit 110 for a transistor-based stress sensor 10. This exemplary embodiment corresponds essentially to the exemplary embodiment discussed earlier with reference to FIG. 17. However, one difference is that the first MOS transistor arrangement 11 and the second MOS transistor arrangement 12 are not arranged in a +/−45° configuration as before, but in a 0°/90° configuration. As already mentioned, the arrangement of the first MOS transistor arrangement 11 and the second MOS transistor arrangement 12 in the substrate plane at an angle of 0°/90° is particularly suitable for determining a mechanical differential stress component $\sigma_{XX}-\sigma_{YY}$. Transistors of the p-channel type are preferably applicable for this purpose.

An input signal 114 with an essentially constant bias voltage is fed into the transistor-based stress sensor 10. The output signal 111 of the transistor-based stress sensor 10 can be compared with a reference signal 112. In this example, the reference signal 112 has a constant voltage of 1V. In addition, the magnitude of the reference signal 112 can be essentially the same as the magnitude of the input signal 114 which is fed into the transistor-based stress sensor 10. In this example, the deviation of the output signal 111 from the reference signal 112 is +/−414 mV. This deviation corresponds to a measure (direction and/or magnitude) of the mechanical stress component that acts on the semiconductor substrate 20.

According to this exemplary embodiment, the evaluation circuit 110 can be designed to determine the magnitude of the deviation based on a difference (e.g. +/−414 mV) between the gradient-compensated output signal 111 and the reference signal 112.

However, it is also conceivable that the evaluation circuit 110 determines the magnitude of the deviation based on a factorial ratio between the gradient-compensated output signal 111 and the reference signal 112.

Figure 21:
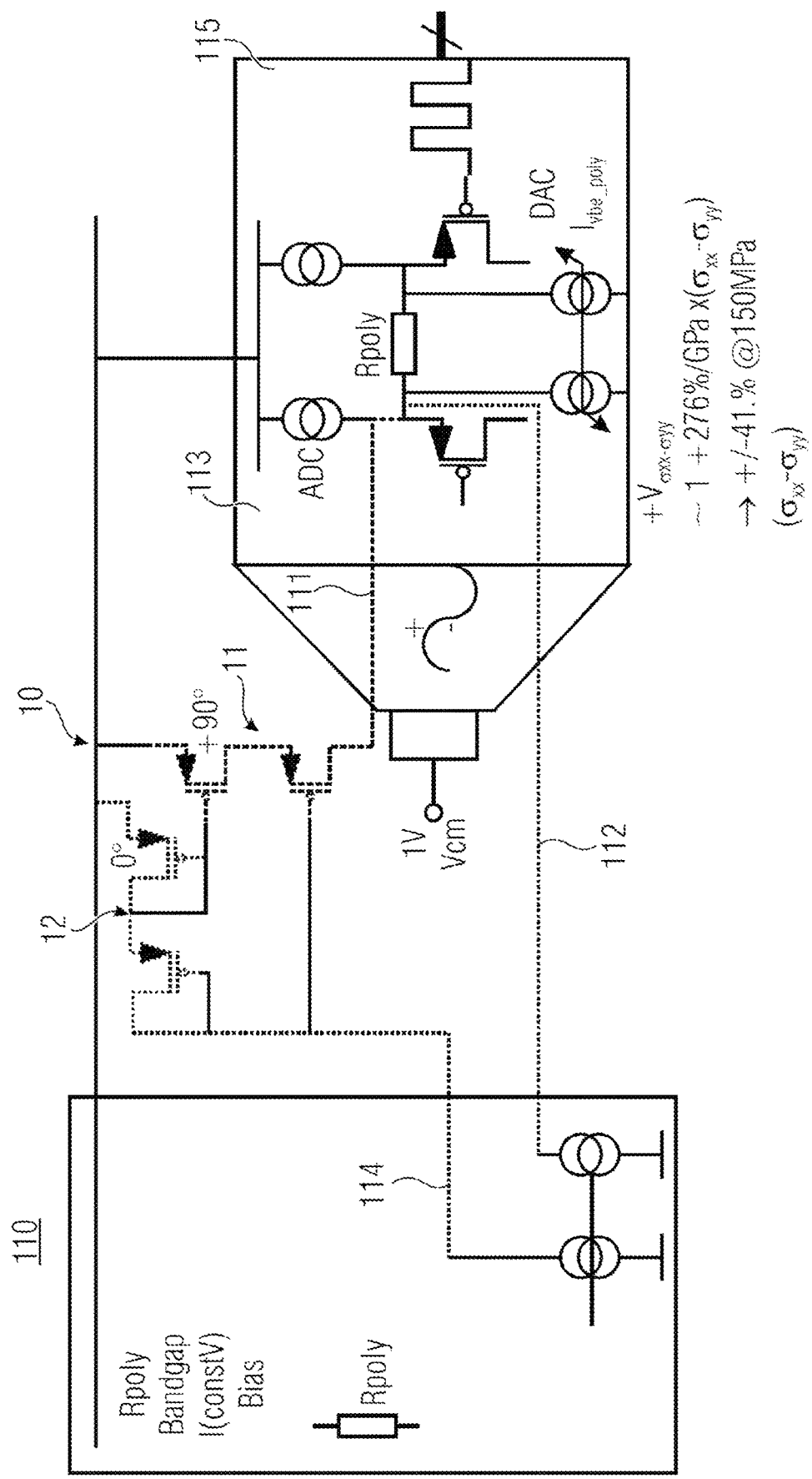
FIG. 21 shows a circuit diagram of a transistor-based stress sensor in a 0°/90° configuration with a current-based evaluation circuit according to an exemplary embodiment.

FIG. 21 shows another exemplary embodiment of an evaluation circuit 110 for a transistor-based stress sensor 10 in a 0°/90° configuration, in particular for determining a mechanical differential stress component $\sigma_{XX}-\sigma_{YY}$. Transistors of the p-channel type are again preferably applicable for this purpose.

An input signal 114 with an essentially constant current is fed into the transistor-based stress sensor 10. The output signal 111 of the transistor-based stress sensor 10 can be compared with a reference signal 112. In this example, the reference signal 112 has a constant current. In addition, the magnitude of the reference signal 112 can be essentially the same as the magnitude of the input signal 114 which is fed into the transistor-based stress sensor 10. In this example, the deviation of the output signal 111 from the reference signal 112 is +/−41%. This deviation corresponds to a measure (direction and/or magnitude) of the mechanical stress component that acts on the semiconductor substrate 20.

Both the output signal 111 of the stress sensor 10 and the reference signal 112 can be fed into an analog-to-digital converter (ADC) 113. The ADC 113 can be designed to compare the output signal 111 against the reference signal 112 and to generate an appropriately digitized output signal 115 which represents the mechanical stress to be detected.

According to this exemplary embodiment, the evaluation circuit 110 can be designed to determine the magnitude of the deviation based on a factorial ratio between the gradient-compensated output signal 111 and the reference signal 112. This means that in this example, the deviation of the output signal 111 from the reference signal 112 can have a factorial ratio with a factor of 1.41, which corresponds to a percentage of 41%.

However, it is also conceivable that the evaluation circuit 110 determines the magnitude of the deviation based on a difference value between the gradient-compensated output signal 111 and the reference signal 112.

Figure 22:
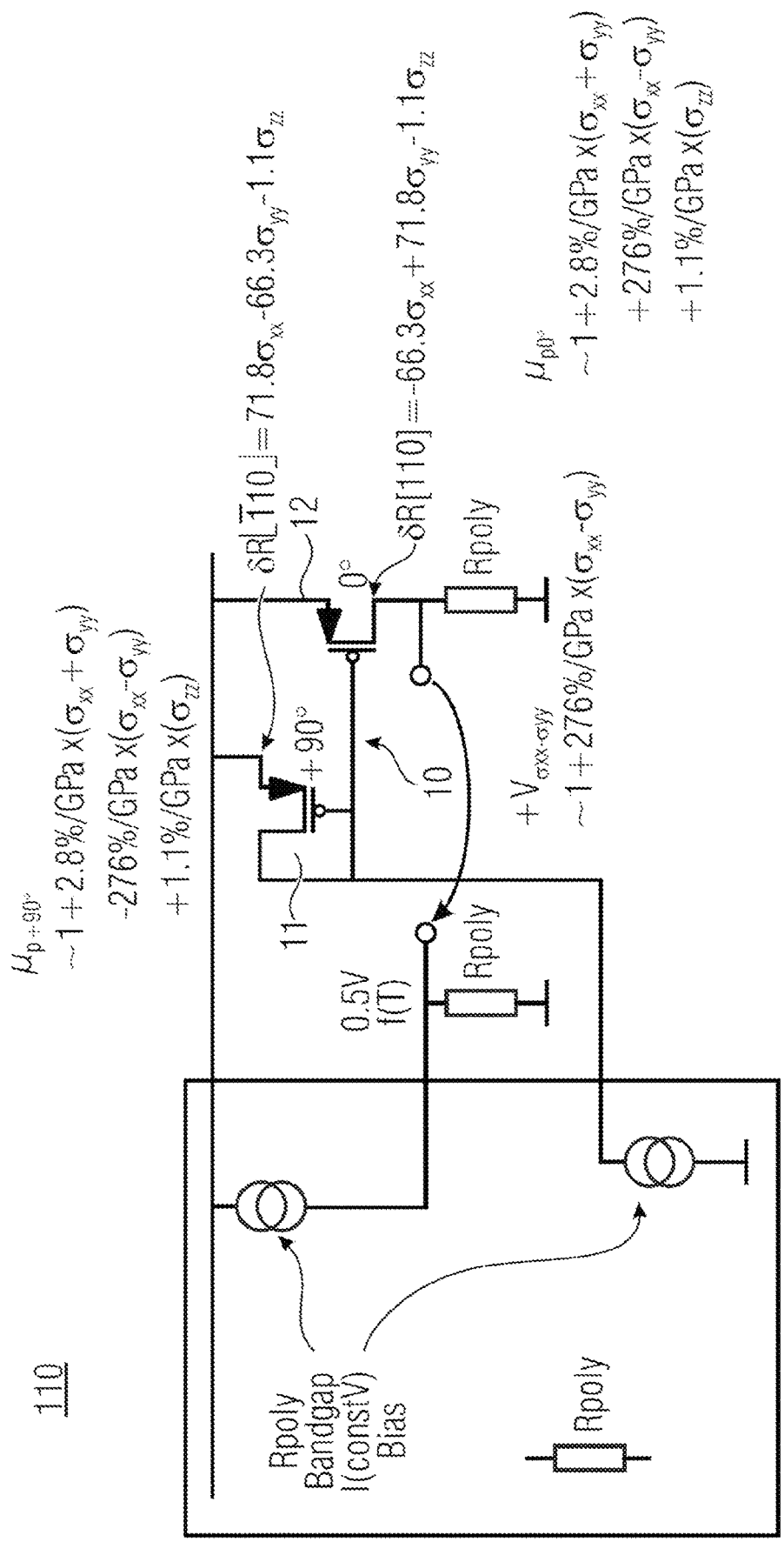
FIG. 22 shows a circuit diagram of a transistor-based stress sensor in a 0°/90° configuration for determining the mechanical stress components according to an exemplary embodiment.

FIG. 22 shows a schematic equivalent circuit diagram of the transistor-based stress sensor 10 together with the respective stress dependencies of the individual MOS transistor arrangements 11, 12 in a 0°/90° configuration. For example, the first MOS transistor array 11 can be aligned in the [$\bar{1}$10] direction, and the second MOS transistor array 12 can be aligned in the [110] direction.

For example the first MOS transistor array 11, aligned in the [$\bar{1}$10]-direction, has the following total direction-dependent sensitivities (expressed as a % of the resistance change):

$$\delta R[\bar{1}10]=71.8\ \delta_{xx}-66.3\ \delta_{yy}-1.1\ \delta_{zz}.$$

For the so-called total stress of the two normal stress components in the x and y directions for the first MOS transistor arrangement 11 this equates to $$2.8\%/GPa \times (\delta_{xx}+\delta_{yy}).$$

The so-called differential stress of the two normal stress components in the x and y directions in the first MOS transistor arrangement 11 is equal to $$-276\%/GPa \times (\delta_{xx}-\delta_{yy})$$

In addition, a normal stress component occurs in the z direction. This is equal to $$1.1\%/GPa \times (\delta_{zz})$$

The second MOS transistor array 12 on the other hand, which is aligned in the [110] direction, has the following total direction-dependent sensitivities (expressed as a % of the resistance change):

$$\delta R[110]=-66.3\ \delta_{xx}+71.8\ \delta_{yy}-1.1\ \delta_{zz}.$$

For the so-called total stress of the two normal stress components in the x and y directions for the second MOS transistor arrangement 12 this equates to $$2.8\%/\text{GPa} \times (\delta_{xx}+\delta_{yy}).$$

The so-called differential stress of the two normal stress components in the x and y directions in the second MOS transistor arrangement 12 is equal to $$+276\%/\text{GPa} \times (\delta_{xx}-\delta_{yy})$$

In addition, a normal stress component also occurs in the z direction. This is equal to $$1.1\%/\text{GPa} \times (\delta_{zz})$$

If the sum $\delta R[\bar{1}10]+\delta R[110]$ of these two direction-dependent resistance changes is formed, the total stress $(\delta_{xx}+\delta_{yy})$ and the normal stress component $\sigma_{ZZ}$ cancel out. These stress components can occur due to unwanted gradients that act upon the semiconductor substrate 20. However, due to the symmetrical arrangement of the first and second MOS transistor arrangements 11, 12 relative to each other, these stress components cancel each other out and a gradient-compensated or an essentially gradient-free output signal is obtained. As can be seen in FIG. 22, only the differential stress component $(\delta_{xx}-\delta_{yy})$ remains.

Accordingly, the effective $\mu_p$ of two stress sensors 10 connected in parallel in a 0°/90° configuration is approximately $$\sim 1+2.8\%/\text{GPa} \times (\delta_{xx}+\delta_{yy})+1.1\%/\text{GPa} \times (\delta_{zz})$$

This means that the effective stress dependence of such a stress sensor 10 in a 0°/90° configuration according to the embodiments described herein is approximately $$\sim 1-276\%/\text{GPa} \times (\delta_{xx}+\delta_{yy})$$

Figure 23:
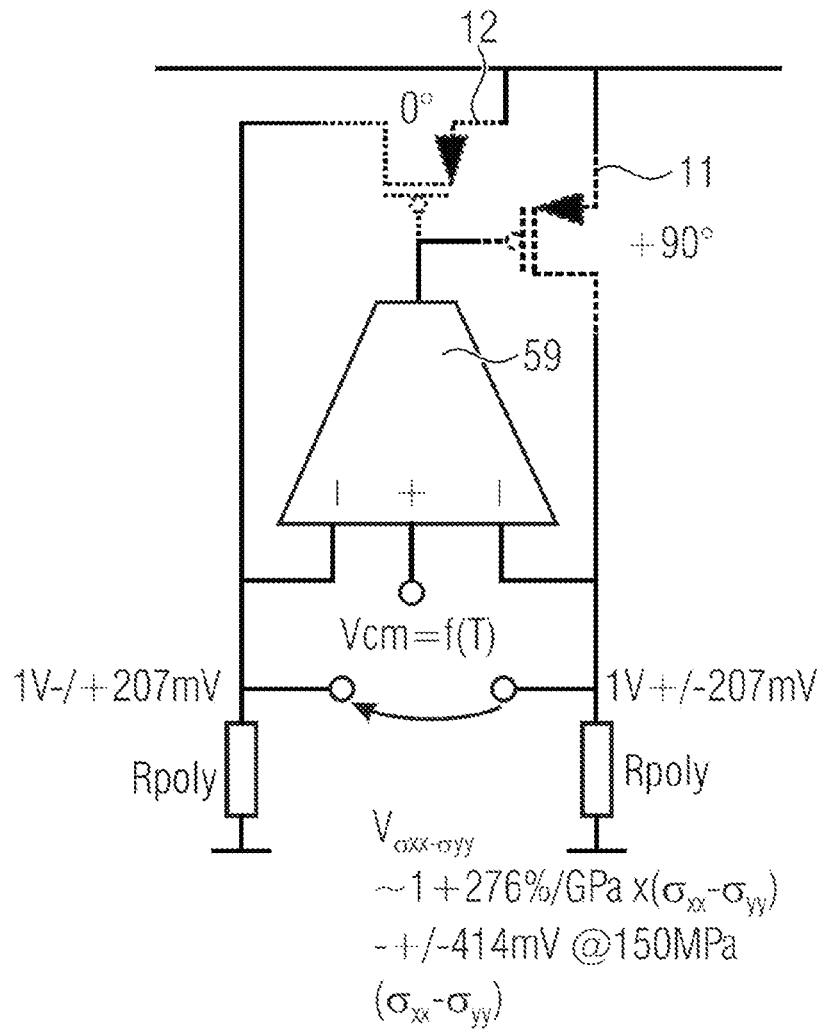
FIG. 23 shows a circuit diagram of a transistor-based stress sensor in a 0°/90° configuration with a common-mode controlled regulator according to an exemplary embodiment.

FIG. 23 shows another exemplary embodiment of an evaluation circuit 110, also using the example of a 0°/90° configuration. The evaluation circuit 110 has a common-mode signal-controlled regulator 59. Here, a differential voltage of the stress sensor 10 can again be measured.

A temperature-dependent or constant common-mode signal voltage can be regulated by means of the common-mode signal-controlled regulator 59.

In accordance with the embodiments described herein, the first MOS transistor arrangement 11 can be arranged on the substrate point-symmetrically with respect to the second MOS transistor arrangement 12. For example, the point of symmetry can be the central point of the two MOS transistor arrays 11, 12.

FIG. 24A shows once again one of the previously discussed exemplary embodiments, in which the transistors 1, 2, 3, 4 were always arranged in a star shape around the center point 50. The transistors 1, 2 of the first MOS transistor arrangement 11 are located opposite each other in such a way that they are located on a common first symmetry line 56. The transistors 3, 4 of the second MOS transistor arrangement 12 are also located opposite each other such that they are located on a common second symmetry line 57. The first and second symmetry lines 56, 57 are perpendicular to each other.

Figure 24B:
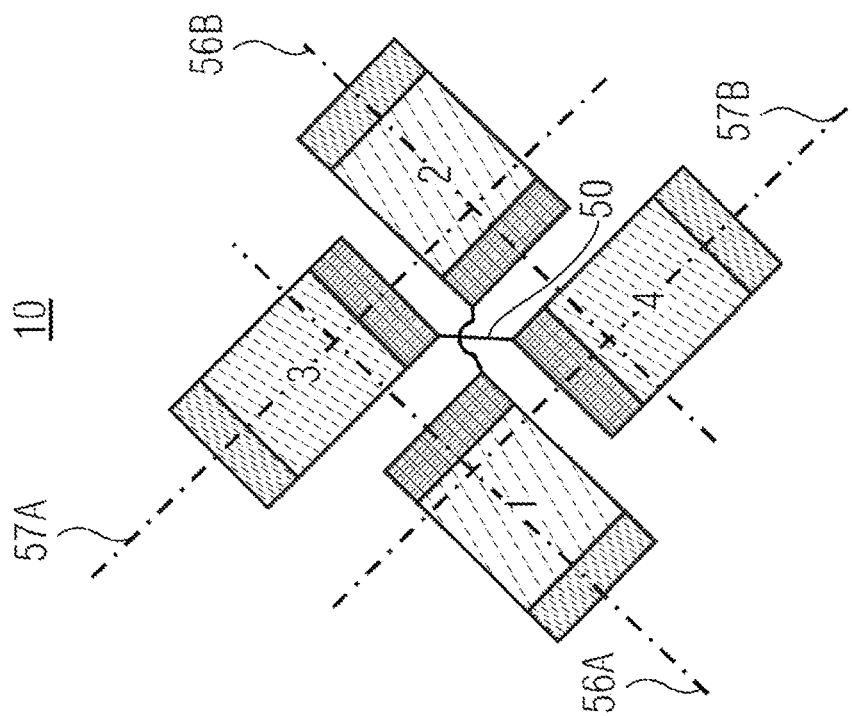
FIG. 24B shows a schematic view of a transistor-based stress sensor in a +/−45° configuration with a space-saving alternative interconnection of transistors according to an exemplary embodiment.
Figure 24A:
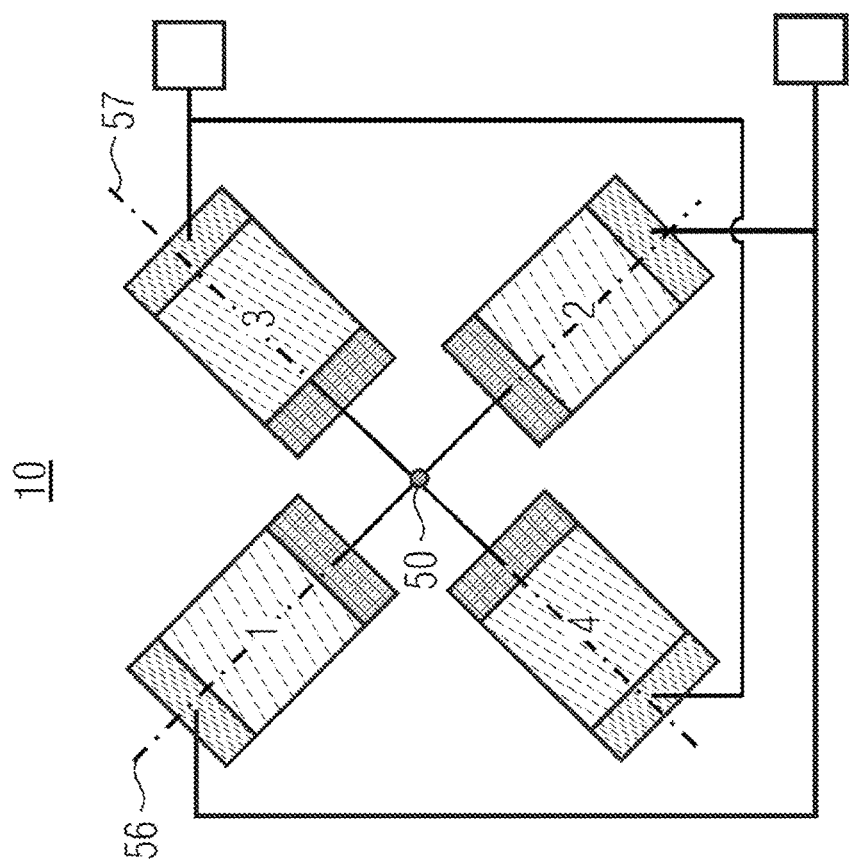
FIG. 24A shows a schematic view of a transistor-based stress sensor in a +/−45° configuration with transistors connected in a star arrangement according to an exemplary embodiment.

FIG. 24B shows a further conceivable design, which is significantly more compact, and which is of course compatible or combinable with all the embodiments of the stress sensor 10 described here. In this design, the transistors 1, 2, 3, 4 are aligned relative to each other in a kind of fishbone arrangement. This means that only the inner corners of the respective transistors 1, 2, 3, 4 point towards the center point 50.

The first transistor 1 of the first MOS transistor arrangement 11 is arranged along a first axis of symmetry 56A, and the second transistor 2 of the first MOS transistor arrangement 11 is arranged along a second axis of symmetry 56B. The first axis of symmetry 56A runs parallel, but spatially offset, to the second axis of symmetry 56B.

The third transistor 3 of the second MOS transistor arrangement 12 is arranged along a third axis of symmetry 57A, and the fourth transistor 4 of the second MOS transistor arrangement 12 is arranged along a fourth axis of symmetry 57B. The third axis of symmetry 57A runs parallel, but spatially offset, to the fourth axis of symmetry 57B.

The axes of symmetry 56A, 56B of the first MOS transistor arrangement 11 are perpendicular to the axes of symmetry 57A, 57B of the second MOS transistor arrangement 12.

The embodiments described herein also relates to a stress measuring device 90 having at least two transistor-based stress sensors 10A, 10B of the kind described here.

Figure 25:
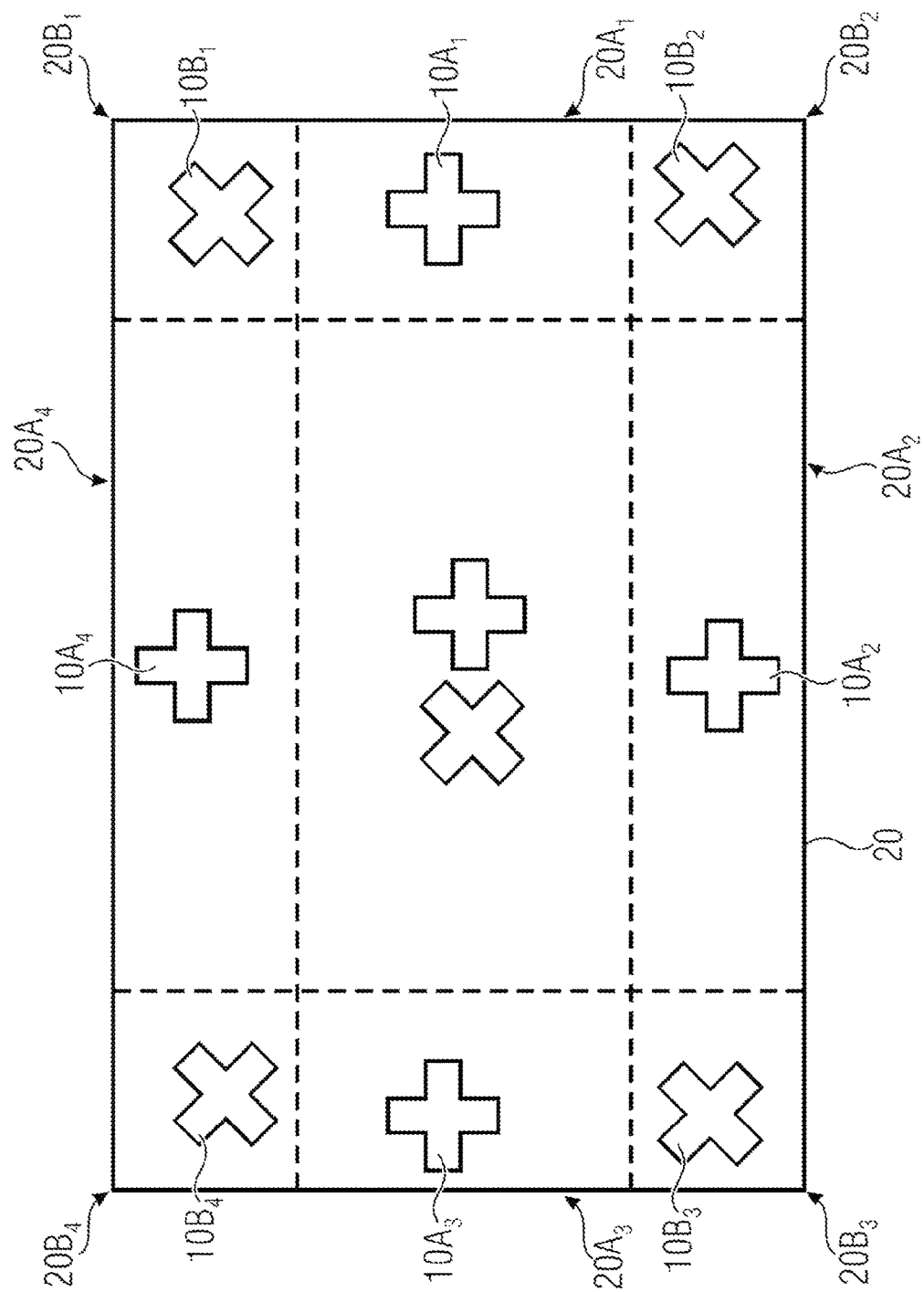
FIG. 25 shows a schematic view of a stress measuring device with at least two transistor-based stress sensors according to an exemplary embodiment.

FIG. 25 shows a schematic view of a possible exemplary embodiment of such a stress measuring device 90 as well as possible positions of the two or more transistor-based stress sensors 10A, 10B. The stress measuring device 90 has at least one first transistor-based stress sensor and a second transistor-based stress sensor. The transistor-based stress sensors are arranged on the semiconductor substrate 20, or integrated into the semiconductor substrate 20.

As was mentioned in the introduction, the present concept relates on the one hand to transistor-based stress sensors in a +/−45° configuration, which are particularly suitable for measuring a mechanical shear stress component $\sigma_{XY}$, $\sigma_{YZ}$, $\sigma_{XZ}$ acting on the semiconductor substrate 20. In particular, n-MOS transistors can be used for this purpose. On the other hand, the present concept relates to transistor-based stress sensors in a 0°/90° configuration, which are particularly suitable for measuring a mechanical differential stress component $\sigma_{XX}-\sigma_{YY}$ acting on the semiconductor substrate 20. In particular, p-MOS transistors can be used for this purpose.

In the schematic view in FIG. 25, the transistor-based stress sensors in the 0°/90° configuration are marked with the reference sign 10A. The transistor-based stress sensors in the +/−45° configuration, on the other hand, are marked with the reference sign 10B.

As mentioned earlier, the stress measuring device 90 comprises at least two transistor-based stress sensors. For example, the stress measuring device 90 can comprise at least two transistor-based stress sensors 10A in the 0°/90° configuration. Alternatively, or additionally, the stress measuring device 90 can comprise, for example, at least two transistor-based stress sensors 10B in the +/−45° configuration. Alternatively, or additionally, the stress measuring device 90 can comprise, for example, at least one transistor-based stress sensor 10A in the 0°/90° configuration and at least one transistor-based stress sensor 10B in the +/−45° configuration.

A first stress sensor can be arranged in a first substrate region 20A of the semiconductor substrate 20. For example, this can be a stress sensor 10A in the 0°/90° configuration, which is arranged along an outer edge 20A of the semiconductor substrate 20.

In possible exemplary embodiments, one or more additional stress sensors 10A can be arranged in the 0°/90° configuration along one or more other outer edges 20A of the semiconductor substrate 20, as shown in the example of FIG. 25. For example, a first stress sensor $10A_1$ can be arranged in the 0°/90° configuration along a first outer edge $20A_1$. Alternatively, or additionally, a second stress sensor $10A_2$ can be arranged in the 0°/90° configuration along a second outer edge $20A_2$. Alternatively, or additionally, a third stress sensor $10A_3$ can be arranged in the 0°/90° configuration along a third outer edge $20A_3$. Alternatively, or additionally, a fourth stress sensor $10A_4$ can be arranged in the 0°/90° configuration along a fourth outer edge $20A_4$.

Differential stress occurs in particular along the outer edges 20A of semiconductor substrate 20. Therefore, an arrangement of stress sensors 10A in the 0°/90° configuration, for measuring differential stress components $\sigma_{XY}$, $\sigma_{YZ}$, $\sigma_{XZ}$, along one or more outer edges 20A of the semiconductor substrate 20 is particularly advantageous.

A second transistor-based stress sensor can be arranged in a second substrate region 20B of the semiconductor substrate 20, which is different to and spatially separated from the first substrate region 20A. For example, this can be a stress sensor 10B in the +/−45° configuration, which is arranged in a corner 20B of the semiconductor substrate 20.

In possible exemplary embodiments, one or more additional stress sensors 10B can be arranged in the +/−45° configuration in one or more corners 20B of the semiconductor substrate 20, as shown in the example of FIG. 25. For example, a first stress sensor $10B_1$ can be arranged in the +/−45° configuration in a first corner $20B_1$. Alternatively, or additionally, a second stress sensor $10B_2$ can be arranged in the +/−45° configuration in a second corner $20B_2$. Alternatively, or additionally, a third stress sensor $10B_3$ can be arranged in the +/−45° configuration in a third corner $20B_3$. Alternatively, or additionally, a fourth stress sensor $10B_4$ can be arranged in the +/−45° configuration in a fourth corner $20B_4$.

Shear stresses occur in particular in the corners 20B of the semiconductor substrate 20. Therefore, an arrangement of stress sensors 10B in the +/−45° configuration, for measuring shear stress components $\sigma_{XY}$, $\sigma_{YZ}$, $\sigma_{XZ}$, in the one or more corners 20B of the semiconductor substrate 20 is particularly advantageous.

A first of these at least two transistor-based stress sensors 10A, 10B delivers a first gradient-compensated output signal which is used to determine a first mechanical stress component acting on the semiconductor substrate 20.

A second of these at least two transistor-based stress sensors 10A, 10B delivers a second gradient-compensated output signal which is used to determine a second mechanical stress component acting on the semiconductor substrate 20.

The stress measuring device 90 is designed to determine a total mechanical stress acting on the semiconductor substrate 20 based on the first and second gradient-compensated output signals.

Conventional stress measuring devices usually have only a single stress sensor which is arranged in the center of the semiconductor substrate 20. The stress measuring device 90 described here with at least two stress sensors 10A and 10B arranged in different substrate regions 20A, 20B can, on the other hand, can deliver significantly more accurate results.

For example, one stress sensor 10B can be arranged in one, in multiple or all corners 20B of the semiconductor substrate 20 each, wherein each of these stress sensors 10B delivers a gradient-compensated output signal as described above. The stress measuring device 90 can now combine all these individual gradient-compensated output signals to determine a total stress acting on the semiconductor substrate 20, and in particular a shear stress-indexed total stress.

Alternatively, or additionally, a stress sensor 10A can be arranged along one, multiple or all outer edges 20A of the semiconductor substrate 20 each, wherein each of these stress sensors 10A delivers a gradient-compensated output signal as described above. The stress measuring device 90 can then combine all these individual gradient-compensated output signals to determine a total stress acting on the semiconductor substrate 20, in this case in particular a differential stress.

In particular with the stress sensors 10A arranged along the outer edges 20A in the 0°/90° configuration, it can be advantageous if these are arranged centrally on the respective outer edge 20A. This means that, if the total length of an outer edge 20A is considered, the stress sensors 10A can be arranged at half the length of the respective outer edge 20A. A deviation of ±10% up to ±20% from half the length (i.e. from the center of the outer edge) is tolerable and also included within the scope of the protective claims.

In summary, the concept described here thus proposes one or more transistor-based stress sensors 10. These are configured in particular to determine shear-stress induced stress (0°/90° configuration with n-MOS transistors) or differential stress (±45° configuration with p-MOS transistors).

These forms of stress information allow external compensation (e.g. in a microprocessor) of the respective stress component to achieve a higher accuracy and improved stability over the entire lifetime of the components installed on the semiconductor substrate.

For example, the shear-stress induced stress determined by means of the stress sensors 10 can be used in particular to compensate for the stress dependence of the orthogonality error in vertical Hall plates (which are arranged on the same semiconductor substrate 20).

The differential stress determined by means of the stress sensors 10, on the other hand, can be used in particular to compensate for stress dependencies in oscillators and band-gaps as well as residual stress dependencies in Hall-voltage sensors (which are arranged on the same semiconductor substrate 20).

In general, the stress information that can be determined using the stress sensors 10 can be used to increase the precision of the following components:

Hall voltage-based angle sensors;
LinHal sensor extensions;
AMR and Hall voltage-based functional safe angle sensors;
3D sensor derivatives;
Precise voltage measurement ICs (battery monitoring) and band gaps; and
Precise oscillators and high-speed interfaces.

The arrangement of the transistors 1, 2, 3, 4 of the first and second MOS transistor arrangements 11, 12 can be mirror-symmetrical, rotationally symmetrical, or point-symmetrical.

The exemplary embodiments described above only represent an illustration of the principles of the embodiments described herein. It is implicit that modifications and variations of the arrangements and details described herein will be apparent to other persons skilled in the art. It is therefore intended that the concept described here be limited only by the scope of protection of the following patent claims and not by the specific details, which have been presented herein on the basis of the description and explanation of the exemplary embodiments.

Although some aspects have been described in connection with a device, it goes without saying that these aspects also represent a description of the corresponding method, so that a block or a component of a device is also to be understood as a corresponding method step or as a feature of a method step. Similarly, aspects that have been described in relation to or as a method step also represent a description of a corresponding block or detail or feature of a corresponding device.

Some or all of the method steps can be performed by a hardware device (or by using a hardware device), such as a microprocessor, a programmable computer, or an electronic circuit. In some exemplary embodiments, some or more of the most important method steps can be performed by such a device.

Depending on specific implementation requirements, exemplary embodiments may be implemented in hardware or software, or at least partially in hardware or at least partially in software. The implementation can be carried out by using a digital storage medium, such as a floppy disk, a DVD, a BluRay disc, a CD, a ROM, a PROM, or an EPROM, EEPROM or Flash memory, a hard disk or other magnetic or optical storage, on which electronically readable control signals are stored, which can interact with a programmable hardware component or interact in such a way that the respective method is carried out. Therefore, the digital storage medium can be computer-readable.

Some exemplary embodiments thus comprise a data carrier, which has electronically readable control signals that are capable of interacting with a programmable computer system in such a way that one of the methods described herein is carried out.

In general, exemplary embodiments may be implemented as a computer program product with a program code, wherein the effect of the program code is to carry out one of the methods when the computer program product is executed on a computer.

For example, the program code can also be stored on a machine-readable medium.

Other exemplary embodiments comprise the computer program for carrying out any of the methods described herein, the computer program being stored on a machine-readable medium. In other words, one exemplary embodiment of the method described here is therefore a computer program that has program code for carrying out one of the methods described herein when the computer program is executed on a computer.

A further exemplary embodiment of the method described here is therefore a data carrier (or a digital storage medium or a computer-readable medium), on which the program for carrying out one of the methods described herein is recorded. The data medium or the digital storage medium or the computer-readable medium are typically tangible and/or non-volatile.

Another exemplary embodiment of the method described here is therefore a data stream or a sequence of signals which represent or represents the computer program for carrying out one of the methods described herein. The data stream or the sequence of signals can be configured, for example, so as to be transferred over a data communication connection, for example via the internet.

A further exemplary embodiment comprises a processing device, such as a computer or a programmable logic device, which is configured or adapted to carry out any of the methods described herein.

Another exemplary embodiment comprises a computer on which the computer program for carrying out any of the methods described herein is installed.

A further exemplary embodiment comprises a device or system which is designed to transmit a computer program to a receiver for carrying out at least one of the methods described herein. The transmission can take place by electronic or optical means, for example. The receiver can be a computer, a mobile device, a storage device, or a similar device. For example, the device or system may comprise a file server to transmit the computer program to the receiver.

In some exemplary embodiments, a programmable logic device (such as a field programmable gate array, an FPGA) can be used to perform some or all of the functions of the methods described herein. In some exemplary embodiments, a field-programmable gate array can interact with a microprocessor to carry out any of the methods described herein. In general, the methods in some exemplary embodiments are carried out by any hardware device. This can be a universally applicable hardware such as a computer processor (CPU) or hardware specific to the method, such as an ASIC.

What is claimed is:

1. A transistor-based stress sensor, comprising:
   a semiconductor substrate with a first MOS transistor arrangement and a second MOS transistor arrangement,
   wherein the first MOS transistor arrangement has a first MOS transistor with a first source-drain channel region and a second MOS transistor with a second source-drain channel region, wherein the first MOS transistor and the second MOS transistor are aligned relative to each other such that a current flow direction in the first source-drain channel region is opposite to a current flow direction in the second source-drain channel region, and
   wherein the second MOS transistor arrangement has a third MOS transistor with a third source-drain channel region and a fourth MOS transistor with a fourth source-drain channel region, wherein the third MOS transistor and the fourth MOS transistor are aligned relative to each other such that a current flow direction in the third source-drain channel region is opposite to a current flow direction in the fourth source-drain channel region,
   wherein the transistor-based stress sensor is configured to generate a gradient-compensated output signal which is used to determine at least one mechanical stress component acting on the semiconductor substrate.

2. The transistor-based stress sensor as claimed in claim 1, wherein:
   the current flow direction in the first source-drain channel region extends at a first angle to a normal of a primary flat plane of the semiconductor substrate,
   the current flow direction in the third source-drain channel region extends at a second angle to the normal of the primary flat plane of the semiconductor substrate, and
   the first angle and the second angle are perpendicular to each other.

3. The transistor-based stress sensor as claimed in claim 2, wherein:
   the first angle is +45° and the second angle is −45°, and
   the transistor-based stress sensor is configured to determine a mechanical shear stress component acting on the semiconductor substrate.

4. The transistor-based stress sensor as claimed in claim 3, wherein:
   the first and the second MOS transistors of the first MOS transistor arrangement and the third and the fourth MOS transistors of the second MOS transistor arrangement are each n-channel type MOS transistors.

5. The transistor-based stress sensor as claimed in claim 2, wherein:
   the first angle is 90° and the second angle is 0°, and
   the transistor-based stress sensor is configured to determine a mechanical differential stress component acting on the semiconductor substrate.

6. The transistor-based stress sensor as claimed in claim 5, wherein:
the first and the second MOS transistors of the first MOS transistor arrangement and the third and the fourth MOS transistors of the second MOS transistor arrangement are each p-channel type MOS transistors.

7. The transistor-based stress sensor as claimed in claim 1, wherein:
the first MOS transistor arrangement is arranged in a substrate plane of the semiconductor substrate and is point-symmetrical with respect to the second MOS transistor arrangement.

8. The transistor-based stress sensor as claimed in claim 1, wherein:
drain terminals of the first and the second MOS transistors of the first MOS transistor arrangement are interconnected, and
wherein drain terminals of the third and the fourth MOS transistors of the second MOS transistor arrangement are interconnected.

9. The transistor-based stress sensor as claimed in claim 1, wherein:
the first MOS transistor arrangement includes a fifth MOS transistor that shares a common drain region with the first MOS transistor, and includes a sixth MOS transistor that shares a common drain region with the second MOS transistor, and
the second MOS transistor arrangement includes a seventh MOS transistor that shares a common drain region with the third MOS transistor, and includes an eighth MOS transistor that shares a common drain region with the fourth MOS transistor.

10. The transistor-based stress sensor as claimed in claim 1, further comprising a first cascode transistor, a second cascode transistor, a third cascode transistor, and a fourth cascode transistor:
wherein the first MOS transistor is connected to the first cascode transistor to form a first cascode circuit,
wherein the second MOS transistor is connected to the second cascode transistor to form a second cascode circuit,
wherein the third MOS transistor is connected to the third cascode transistor to form a third cascode circuit, and
wherein the fourth MOS transistor is connected to the fourth cascode transistor to form a fourth cascode circuit.

11. The transistor-based stress sensor as claimed in claim 10, further comprising: a fifth cascode circuit, a sixth cascode circuit, a seventh cascode circuit, and an eighth cascode circuit:
wherein the first cascode circuit is connected to a fifth cascode circuit at a first common drain terminal,
wherein the second cascode circuit is connected to a sixth cascode circuit at a second common drain terminal,
wherein the third cascode circuit is connected to an eighth cascode circuit at a third common drain terminal, and
wherein the fourth cascode circuit is connected to a seventh cascode circuit at a fourth common drain terminal, and
wherein the first through the eighth cascode circuits are arranged in a substrate plane of the semiconductor substrate in such a way that:
a current flow direction of the interconnected first and fifth cascode circuits is opposite to a current flow direction of the interconnected second and sixth cascode circuits, and a current flow direction of the interconnected third and eighth cascode circuits is opposite to a current flow direction of the interconnected fourth and seventh cascode circuits.

12. The transistor-based stress sensor as claimed in claim 1, further comprising:
an evaluation circuit configured to compare the gradient-compensated output signal of the transistor-based stress sensor with a reference signal, wherein a deviation from the reference signal defines a measure of the mechanical stress component, and
wherein the evaluation circuit is configured to:
determine a magnitude of the deviation based on a difference value between the gradient-compensated output signal and the reference signal, or
determine the magnitude of the deviation based on a factorial ratio between the gradient-compensated output signal and the reference signal.

13. The transistor-based stress sensor as claimed in claim 12, wherein:
the reference signal is an electrical reference voltage or an electrical reference current, and wherein a magnitude of the reference signal is equal to a magnitude of an input signal of the transistor-based stress sensor.

14. A stress measuring device, comprising:
a semiconductor substrate;
a first transistor-based stress sensor, comprising:
a first MOS transistor arrangement and a second MOS transistor arrangement arranged in the semiconductor substrate,
wherein the first MOS transistor arrangement has a first MOS transistor with a first source-drain channel region and a second MOS transistor with a second source-drain channel region, wherein the first MOS transistor and the second MOS transistor are aligned relative to each other such that a current flow direction in the first source-drain channel region is opposite to a current flow direction in the second source-drain channel region, and
wherein the second MOS transistor arrangement has a third MOS transistor with a third source-drain channel region and a fourth MOS transistor with a fourth source-drain channel region, wherein the third MOS transistor and the fourth MOS transistor are aligned relative to each other such that a current flow direction in the third source-drain channel region is opposite to a current flow direction in the fourth source-drain channel region,
wherein the first transistor-based stress sensor is configured to generate a first gradient-compensated output signal which is used to determine a first mechanical stress component acting on the semiconductor substrate; and
a second transistor-based stress sensor, comprising:
a third MOS transistor arrangement and a fourth MOS transistor arrangement arranged in the semiconductor substrate,
wherein the third MOS transistor arrangement has a fifth MOS transistor with a fifth source-drain channel region and a sixth MOS transistor with a sixth source-drain channel region, wherein the fifth MOS transistor and the sixth MOS transistor are aligned relative to each other such that a current flow direction in the fifth source-drain channel region is opposite to a current flow direction in the sixth source-drain channel region, and wherein the fourth MOS transistor arrangement has a seventh MOS transistor with a seventh source-drain channel region and a eighth MOS transistor with a eighth source-drain channel region, wherein the seventh MOS transistor and the eighth MOS transistor are aligned relative to each other such that a current flow direction in the seventh source-drain channel region is opposite to a current flow direction in the eighth source-drain channel region, wherein the second transistor-based stress sensor is configured to generate a second gradient-compensated output signal which is used to determine a second mechanical stress component acting on the semiconductor substrate, wherein the first transistor-based stress sensor is arranged in a first substrate region of the semiconductor substrate, and wherein the second transistor-based stress sensor is arranged in a second substrate region of the semiconductor substrate, which is different to and spatially separated from the first substrate region, and wherein the stress measuring device is configured to determine a total mechanical stress acting on the semiconductor substrate based on the first and the second gradient-compensated output signals.

15. The stress measuring device as claimed in claim 14, wherein:

the first transistor-based stress sensor is arranged in a first corner of the semiconductor substrate, and the second transistor-based stress sensor is arranged in a second corner of the semiconductor substrate, which is different from the first corner, and the first and the second transistor-based stress sensors are each configured to determine a mechanical shear stress component acting in its respective corner of the semiconductor substrate.

16. The stress measuring device as claimed in claim 14, wherein:

the first transistor-based stress sensor is located along a first outer edge of the semiconductor substrate, and the second transistor-based stress sensor is located along a second outer edge of the semiconductor substrate, which is different from the first outer edge, and the first and the second transistor-based stress sensors are each configured to determine a mechanical differential stress component acting along its respective outer edge of the semiconductor substrate.

17. The stress measuring device as claimed in claim 16, wherein:

the first transistor-based stress sensor is arranged on half of a total length of the first outer edge, and the second transistor-based stress sensor is arranged on half of a total length of the second outer edge.

18. A method for a gradient-compensated determination of a mechanical stress component acting on a semiconductor substrate, by means of a transistor-based stress sensor, the method comprising:

applying an input signal to the transistor-based stress sensor and tapping off a gradient-compensated output signal from the transistor-based stress sensor;

comparing the gradient-compensated output signal with a reference signal, wherein a deviation from the reference signal defines a measure of the mechanical stress component; and determining a magnitude of the deviation based on a difference value between the gradient-compensated output signal and the reference signal, or based on a factorial ratio between the gradient-compensated output signal and the reference signal.

19. A non-transitory computer-readable medium comprising a computer program having a program code for causing a programmable hardware device to execute the method for the gradient-compensated determination of the mechanical stress component acting on the semiconductor substrate, the computer program comprising the steps of claim 18.

* * * * *